(12) United States Patent
Morohara et al.

(10) Patent No.: US 12,408,473 B2
(45) Date of Patent: Sep. 2, 2025

(54) INFRARED DETECTING DEVICE

(71) Applicant: Asahi Kasei Microdevices Corporation, Tokyo (JP)

(72) Inventors: Osamu Morohara, Tokyo (JP); Hiromi Fujita, Tokyo (JP); Hirotaka Geka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 18/433,426

(22) Filed: Feb. 6, 2024

(65) Prior Publication Data

US 2025/0022972 A1    Jan. 16, 2025

Related U.S. Application Data

(63) Continuation of application No. 16/286,943, filed on Feb. 27, 2019, now Pat. No. 11,935,973.

(30) Foreign Application Priority Data

Feb. 28, 2018  (JP) .............................. JP2018-034760
Aug. 30, 2018  (JP) .............................. JP2018-161748

(51) Int. Cl.
  *H10F 77/124*  (2025.01)
  *H10F 77/16*   (2025.01)

(52) U.S. Cl.
  CPC ......... *H10F 77/1248* (2025.01); *H10F 77/16* (2025.01)

(58) Field of Classification Search
  CPC ....... H10F 77/1248; H10F 77/16; H10F 30/10
  See application file for complete search history.

(56) References Cited

U.S. PATENT DOCUMENTS

| 5,883,564 A | 3/1999 | Partin |
| 10,573,782 B2 | 2/2020 | Morohara et al. |

(Continued)

FOREIGN PATENT DOCUMENTS

| EP | 0515859 A1 | 12/1992 |
| JP | H05129201 A | 5/1993 |

(Continued)

OTHER PUBLICATIONS

B. Corbett et al., Surface recombination in dry etched AlGaAs/GaAs double heterostructure p-i-n mesa diodes, Applied Physics Letters, Jan. 4, 1993, pp. 87-89, vol. 62, No. 1.

(Continued)

*Primary Examiner* — Tucker J Wright
(74) *Attorney, Agent, or Firm* — KENJA IP LAW PC

(57) ABSTRACT

Disclosed is an infrared detecting device with a high SNR. The infrared detecting device includes a semiconductor substrate; a first layer formed on the semiconductor substrate and having a first conductivity type; a light receiving layer formed on the first layer; and a second layer formed on the light receiving layer and having a second conductivity type. The first layer includes, in the stated order: a layer containing $Al_{x(1)}In_{1-x(1)}Sb$; a layer having a film thickness $t_{y(1)}$ in nanometers and containing $Al_{y(1)}In_{1-y(1)}Sb$; and a layer containing $Al_{x(2)}In_{1-x(2)}Sb$, where $t_{y(1)}$, $x(1)$, $x(2)$, and $y(1)$ satisfy the following relations: for j=1, 2, $0<t_{y(1)}\leq 2360\times(y(1)-x(j))-240$ ($0.11\leq y(1)-x(j)\leq 0.19$), $0<t_{y(1)}\leq -1215\times(y(1)-x(j))+427$ ($0.19<y(1)-x(j)\leq 0.33$), and $0<x(j)<0.18$.

12 Claims, 5 Drawing Sheets

(56) References Cited

U.S. PATENT DOCUMENTS

| | | |
|---|---|---|
| 2001/0042503 A1 | 11/2001 | Lo et al. |
| 2006/0027823 A1 | 2/2006 | Hill et al. |
| 2007/0090337 A1 | 4/2007 | Ueno et al. |
| 2010/0171130 A1 | 7/2010 | Ashley et al. |
| 2011/0018010 A1 | 1/2011 | Ueno et al. |
| 2015/0249135 A1 | 9/2015 | Vizbaras et al. |
| 2016/0268461 A1 | 9/2016 | Mishima et al. |

FOREIGN PATENT DOCUMENTS

| | | |
|---|---|---|
| JP | H06196808 A | 7/1994 |
| JP | 2002520824 A | 7/2002 |
| JP | 2002536844 A | 10/2002 |
| JP | 2007081225 A | 3/2007 |
| JP | 2009246207 A | 10/2009 |
| JP | 2010225870 A | 10/2010 |
| JP | 2012209357 A | 10/2012 |
| JP | 2015090901 A | 5/2015 |
| JP | 2016152259 A | 8/2016 |
| JP | 2016163009 A | 9/2016 |
| JP | 2017015507 A | 1/2017 |
| JP | 2017015568 A | 1/2017 |
| JP | 2017183424 A | 10/2017 |
| WO | 0002263 A1 | 1/2000 |
| WO | 2005027228 A1 | 3/2005 |
| WO | 2009113685 A1 | 9/2009 |

OTHER PUBLICATIONS

M. Edirisooriya et al., Effect of Al composition on filtering of threading dislocations by $Al_x In_{1-x} Sb/Al_y In_{1-y} Sb$ heterostructures grown on GaAs (001), Journal of Vacuum Science & Technology B, May 31, 2007, pp. 1063-1065, vol. 25, No. 3.

T. D. Mishima et al., Dislocation filtering by $Al_x In_{1-x} Sb/Al_y In_{1-y} Sb$ interfaces for InSb-based devices grown on GaAs (001) substrates, Applied Physics Letters, May 9, 2006, pp. 191908-1 to 191908-3, vol. 88.

INFRARED DETECTING DEVICE

CROSS REFERENCE TO RELATED APPLICATION

This application is a continuation application of U.S. patent application Ser. No. 16/286,943 filed Feb. 27, 2019, which claims priority of Japanese Patent Application Nos. 2018-034760 (filed on Feb. 28, 2018) and 2018-161748 (filed on Aug. 30, 2018). The disclosures of the prior applications are hereby incorporated by reference herein in their entirety.

TECHNICAL FIELD

This disclosure relates to infrared detecting devices.

BACKGROUND

Generally, infrared rays of a long wavelength band having a wavelength of 2 μm or more are used for human sensors for detecting human bodies, non-contact temperature sensors, gas sensors, and the like, because of its thermal effect and the effect of infrared absorption by a gas. For example, gas sensors can be used for atmospheric environment monitoring and protection, also for early fire detection and the like, and attract attention in recent years. In particular, there are many absorption bands inherent to individual gases in the wavelength range from 2.5 μm to 10.0 μm, which is a wavelength band suitable for use in gas sensors.

SUMMARY

An infrared detecting device according to the present disclosure comprises: a semiconductor substrate; a first layer formed on the semiconductor substrate and having a first conductivity type; a light receiving layer formed on the first layer; and a second layer formed on the light receiving layer and having a second conductivity type. The first layer comprises, in the stated order: a layer containing $Al_{x(1)}In_{1-x(1)}Sb$; a layer having a film thickness $t_{y(1)}$ in nanometers and containing $Al_{y(1)}In_{1-y(1)}Sb$; and a layer containing $Al_{x(2)}In_{1-x(2)}Sb$. Where $t_{y(1)}$, $x(1)$, $x(2)$, and $y(1)$ satisfy the following relations:

$0 < t_{y(1)} \leq 2360 \times (y(1)-x(1))-240 (0.11 \leq y(1)-x(1) \leq 0.19)$, $0 < t_{y(1)} \leq -1215 \times (y(1)-x(1))+427 (0.19 < y(1)-x(1) \leq 0.33)$, $0 < t_{y(1)} \leq 2360 \times (y(1)-x(2))-240 (0.11 \leq y(1)-x(2) \leq 0.19)$, $0 < t_{y(1)} \leq -1215 \times (y(1)-x(2))+427 (0.19 < y(1)-x(2) \leq 0.33)$, $0 < x(1) < 0.18$, and $0 < x(2) < 0.18$.

In addition, an infrared detecting device according to the present disclosure comprises: a semiconductor substrate; a first layer formed on the semiconductor substrate and having a first conductivity type; a light receiving layer formed on the first layer; and a second layer formed on the light receiving layer and having a second conductivity type. The first layer comprises, in the stated order: a layer containing $Al_{x(1)}Ga_{p(1)}In_{1-x(1)-p(1)}Sb$; a layer having a film thickness $t_{y(1)}$ in nanometers and containing $Al_{y(1)}Ga_{q(1)}In_{1-y(1)-q(1)}Sb$; and a layer containing $Al_{x(2)}Ga_{p(2)}In_{1-x(2)-p(2)}Sb$. Where $t_{y(1)}$, $x(1)$, $x(2)$, $y(1)$, $p(1)$, $p(2)$, and $q(1)$ satisfy the following relations:

$0 < t_{y(1)} \leq 2360 \times (y(1)+q(1)-x(1)-p(1))-240 (0.11 \leq y(1)+q(1)-x(1)-p(1) \leq 0.19)$, $0 < t_{y(1)} \leq -1215 \times (y(1)+q(1)-x(1)-p(1))+427 (0.19 < y(1)+q(1)-x(1)-p(1) \leq 0.33)$, $0 < t_{y(1)} \leq 2360 \times (y(1)+q(1)-x(2)-p(2))-240 (0.11 \leq y(1)+q(1)-x(2)-p(2) \leq 0.19)$, $0 < t_{y(1)} \leq -1215 \times (y(1)+q(1)-x(2)-p(2))+427 (0.19 < y(1)+q(1)-x(2)-p(2) \leq 0.33)$, $0 < x(1)+p(1) < 0.18$, $0 < x(2)+p(2) < 0.18$, and $0 < q(1)/(y(1)+q(1)) \leq 1$.

DETAILED DESCRIPTION

Figure 1:
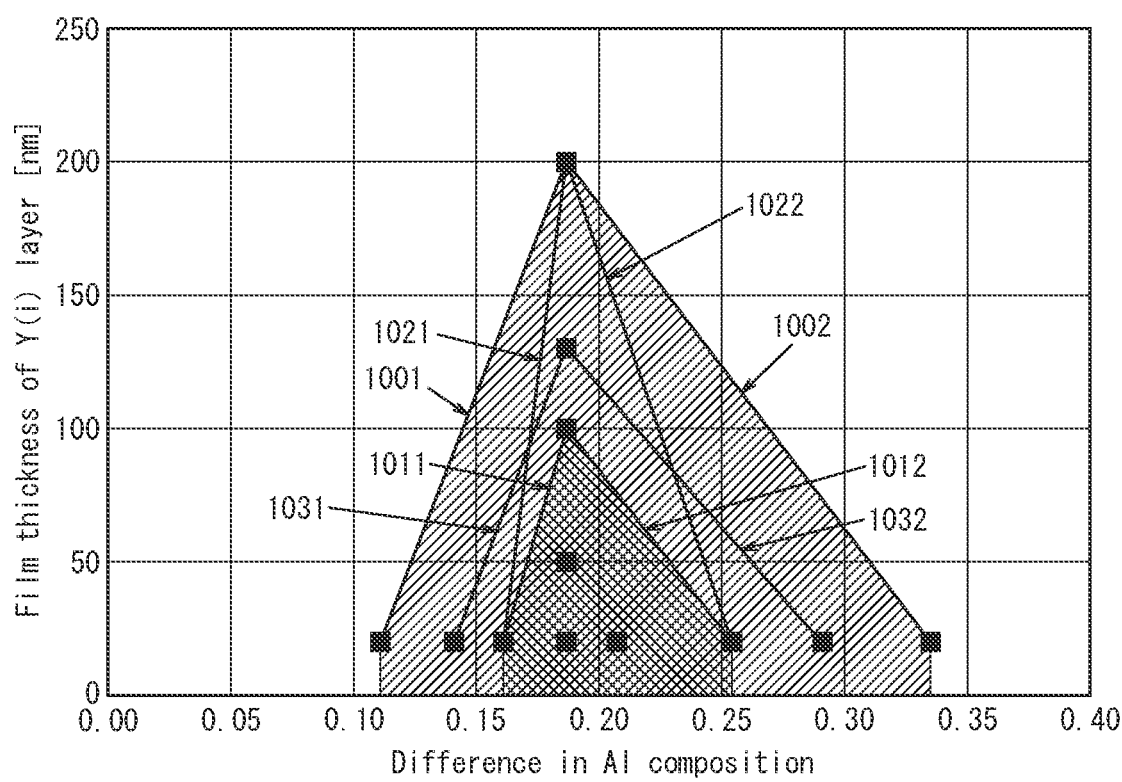
FIG. 1 is a diagram illustrating a relationship between the difference in composition and the film thickness.

Numerous specific configurations will be described in detail below in order to provide a thorough understanding of embodiments of the present disclosure. It will be apparent, however, that other embodiments may be devised without being limited to the disclosed configurations. In addition, the following embodiments do not limit the aspects and concepts of this disclosure defined by the claims, but include all of the combinations of characteristic configurations described in the embodiments.

The infrared detecting device according to this embodiment comprises: a semiconductor substrate; a first layer formed on the semiconductor substrate and having a first conductivity type; a light receiving layer formed on the first layer; and a second layer formed on the light receiving layer and having a second conductivity type. The first layer comprises, in the stated order: a layer containing $Al_{x(1)}In_{1-x(1)}Sb$; a layer having a film thickness $t_{y(1)}$ in nanometers and containing $Al_{y(1)}In_{1-y(1)}Sb$; and a layer containing $Al_{x(2)}In_{1-x(2)}Sb$. Where $t_{y(1)}$, $x(2)$, $x(2)$, and $y(2)$ satisfy the following relations:

$0 < t_{y(1)} \leq 2360 \times (y(1)-x(1))-240 (0.11 \leq y(1)-x(1) \leq 0.19)$, $0 < t_{y(1)} \leq -1215 \times (y(1)-x(1))+427 (0.19 < y(1)-x(1) \leq 0.33)$, $0 < t_{y(1)} \leq 2360 \times (y(1)-x(2))-240 (0.11 \leq y(1)-x(2) \leq 0.19)$, $0 < t_{y(1)} \leq -1215 \times (y(1)-x(2))+427 (0.19 < y(1)-x(2) \leq 0.33)$, 0<x(1)<0.18, and 0<x(2)<0.18.

Here, the SNR of the infrared detecting device is proportional to the product of a photocurrent Ip generated upon incidence of an infrared ray and the square root of an device resistance $R_0$ of the infrared detecting device. That is, it is expressed as:

$$SNR \propto I_p \sqrt{R_0} \quad \text{Expression (1)}$$

Accordingly, by increasing the device resistance $R_0$ without lowering Ip, it is possible to improve the SNR characteristics of the infrared detecting device.

The device resistance $R_0$ of the infrared detecting device is determined by two factors, the resistance against the current through the interior of the mesa structure of the infrared detecting device ($R_d$) and the resistance against the current through the surface of the sidewall of the mesa structure of the infrared detecting device ($R_S$) (Expression (2)). The resistivity against the current through the interior of the mesa structure per area ($R_a$) and the resistivity against the current through the surface of the sidewall of the mesa structure per perimeter ($\alpha$) can be obtained by the slope and intercept of $1/(R_0 \cdot S)$ versus L/S (Expression (3)), respectively.

$$\frac{1}{R_0} = \frac{1}{R_d} + \frac{1}{R_S} = \frac{1}{R_a}S + \frac{1}{\alpha}L \quad \text{Expression (2)}$$

$$\frac{1}{R_0 \cdot S} = \frac{1}{R_a} + \frac{1}{\alpha} \cdot \frac{L}{S} \quad \text{Expression (3)}$$

Herein, $R_0$ is the device resistance of the infrared detecting device, $R_d$ is the resistance against the current through the interior of the mesa structure of the infrared detecting device, $R_S$ is the resistance against the current through the surface of the sidewall of the mesa structure of the infrared detecting device, $R_a$ is the resistivity against the current through the interior of the mesa structure per area, $\alpha$ is the resistivity against the current through the surface of the sidewall of the mesa structure per perimeter, S is the area of the mesa structure of the infrared detecting device, and L is the perimeter of the mesa structure of the infrared detecting device.

Herein, the resistivity against the current through the interior of the infrared detecting device per area $R_a$ (hereafter may be simply referred to as $R_a$) is determined by the magnitude of carrier recombination rate in the light receiving layer in the case that diffusion current is sufficiently suppressed. The magnitude of carrier recombination rate is strongly dependent on the carrier recombination rate via defects in the interior of the light receiving layer, and the carrier recombination rate can be suppressed by reducing the defect density of the light receiving layer. Therefore, reduction of defect density in the light receiving layer leads to increase of $R_a$, and, as a result, it is possible to improve the SNR of the infrared detecting device.

Among others, primary defects in the light receiving layer are line defects that are caused by the difference in lattice constant between the semiconductor substrate and a compound semiconductor material stacked on the substrate, that is, dislocations. It is known that as the thickness of the compound semiconductor material to be stacked increases, the dislocation density decreases. This is mainly because dislocations collide with each other and disappear. However, increasing the film thickness is not preferable because it may increase the film formation time and the difficulty of the device formation process.

One way effective for reducing the density of line defects, namely dislocations, is to apply a dislocation filter layer (in the first embodiment, for example, a layer having a film thickness of $t_{y(1)}$ and containing $Al_{y(1)}In_{1-y(1)}Sb$). The dislocation filter layer is a thin layer that is applied to the base material for the purpose of reducing the density of line defects, namely dislocations, and that is greatly different in lattice constant from the base material. The misfit stress generated by the lattice constant difference between the base material and the dislocation filter layer concentrates on the thin dislocation filter layer, whereby dislocations bend in the lateral direction. Since a plurality of bent dislocations collide with each other and disappear, propagation of dislocations to the upper layer is suppressed. The dislocation filter layer is preferably used because of its ability to reduce dislocations despite its relatively small thickness, with a relatively small increase in the film formation time and in the difficulty of device formation process.

Important design factors of the dislocation filter layer are the lattice constant difference from the base material, the thickness of the dislocation filter layer, and elastic constants such as Poisson's ratio. As the lattice constant difference from the base material becomes larger and the dislocation filter layer becomes thicker, the misfit stress becomes larger, causing dislocations to bend more easily. However, if the misfit stress becomes excessively large, the crystal can not withstand the stress, conversely causing dislocations. The thickness at this time is called the critical film thickness. Although there is a theoretical formula in the critical film thickness, it has been reported that dislocations may be reduced without newly generating dislocations even when the film thickness is larger than the theoretical value, and it is believed that the film thickness necessary for bending of dislocations and the film thickness at which dislocations unwantedly occur are highly dependent on the material system. In this respect, investigation is commonly conducted in such a way that when no new dislocation is generated under a certain condition, the dislocation filter layer is thickened in the next study. This is because the dislocation tends to bend more easily as the dislocation filter layer becomes thicker as described above.

For the material of the infrared detecting device, InSb, AlInSb, InGaSb, InAsSb, or the like that can provide crystals of relatively good quality may be used. For example, when a dislocation filter layer is applied to a base material made of AlInSb, it is preferable to apply a dislocation filter layer containing AlInSb which is the same element type from the viewpoint of ease of the device formation process.

Further, Ga can be used instead of Al, and GaInSb and AlGaInSb can also be preferably used as the base material or the dislocation filter layer. Since the lattice constants and the elastic constants of AlSb and GaSb, which are binary crystals, are close to each other, the lattice constant and the elastic constant of an AlInSb or GaInSb mixed crystal, which is a mixed crystal of these and InSb, also take values close to each other when the Al composition and the Ga composition are the same. Therefore, by replacing "the Al composition" of AlInSb with "the Ga composition" in GaInSb or with "the sum of the Al composition and the Ga composition" in AlGaInSb, it is possible to design a layer that is very close in lattice constant and elastic constant to the desired AlInSb.

Note that when both the base material and the dislocation filter layer are AlInSb, an AlInSb layer different in Al composition from the AlInSb layer of the base material can be applied as a dislocation filter layer, whereby a lattice constant difference and misfit stress can be generated, causing dislocations to bend.

As used herein, the "Al composition" of each layer indicates the ratio of the number of Al elements to all group III elements contained in that layer. Also, the "Ga composition" and the "In composition" of each layer indicates the ratio of the number of Ga elements and In elements to all group III elements contained in that layer, respectively.

According to the infrared detecting device of this embodiment, dislocations, namely line defects, are bent in the lateral direction in the first layer such that the line defect density of the light receiving layer located on the first layer is reduced. By suppressing defective recombination through dislocations in the light receiving layer, it is possible to improve the $R_a$.

As used herein, although "on" in the expression "a first layer formed on the semiconductor substrate and having a first conductivity type" indicates that the first layer is formed on the semiconductor substrate, it is also included in this expression that there is another layer between the semiconductor substrate and the first layer. The term "on" used in expressing the relationship between other layers has the same meaning.

As used herein, "containing" in the expression "a layer containing $Al_{x(1)}In_{1-x(1)}Sb$" indicates that Al, In, and Sb are mainly contained in the layer, yet this expression may also include other elements. Specifically, it is of course included in this expression that a slight change is made to the composition of this layer by adding a small amount of another element (for example, by adding an element such as As, P, Ga, N, or the like by not more than several percent). The term "containing" used in expressing the composition of other layers has the same meaning.

Hereinafter, each component of the infrared detecting device according to this embodiment will be described with examples.

The semiconductor substrate of the infrared detecting device according to this embodiment is not particularly limited as long as a first layer described below can be stacked thereon. Examples of the semiconductor substrate include, but are not limited to, a GaAs substrate, a Si substrate, an InP substrate, and an InSb substrate. From the viewpoint that crystal growth of a compound semiconductor is easy, a GaAs substrate is preferable.

The semiconductor substrate has no limitation in doping with donor impurities or acceptor impurities. However, from the viewpoint of making it possible to connect a plurality of independent infrared detecting devices formed on a conductor substrate in series or in parallel, it is desirable that the semiconductor substrate is semi-insulating or can be insulated and separated from the compound semiconductor layer.

From the viewpoint of stacking a compound semiconductor single crystal, the semiconductor substrate is preferably a single crystal substrate. The plane orientation of the semiconductor substrate is not particularly limited, yet for example (001), (111), and (101) are desirable. It is also preferable to use a plane orientation inclined by 1° to 5° with respect to these plane orientations.

The surface of the semiconductor substrate may be heated in a vacuum to remove the oxide film, or a contaminant such as an organic substance or a metal may be removed before the semiconductor substrate is subjected to a cleaning treatment with an acid or an alkali.

The first layer of the infrared detecting device according to this embodiment is formed on the semiconductor substrate and has a first conductivity type (any one of n type, i type and p type). Further, the first layer comprises, in the stated order: a layer containing $Al_{x(1)}In_{1-x(1)}Sb$ ($0<x(1)<1$); a layer having a film thickness of $t_{y(1)}$ and containing $Al_{y(1)}In_{1-y(1)}Sb$ ($0<y(1)<1$); and a layer containing $Al_{x(2)}In_{1-x(2)}Sb$ ($0<x(2)<1$), where the following relations are satisfied:

$$0<t_{y(1)} \leq 2360 \times (y(1)-x(1))-240 (0.11 \leq y(1)-x(1) \leq 0.19),$$

$$0<t_{y(1)} \leq -1215 \times (y(1)-x(1))+427 (0.19<y(1)-x(1) \leq 0.33),$$

$$0<t_{y(1)} \leq 2360 \times (y(1)-x(2))-240 (0.11 \leq y(1)-x(2) \leq 0.19),$$
and $$0<t_{y(1)} \leq -1215 \times (y(1)-x(2))+427 (0.19<y(1)-x(2) \leq 0.33).$$

The Al composition of each layer of the first layer was obtained as follows by secondary ion mass spectrometry (SIMS) method. For the measurement, a magnetic field type SIMS apparatus IMS 7f manufactured by CAMECA was used. In this method, compositional analysis is performed by irradiating a solid surface with beam type primary ion species, digging in the depth direction by means of sputtering phenomenon, and simultaneously detecting the generated secondary ions. As used herein, the Al composition refers to the ratio of Al element to all 13 group elements contained in each layer.

Specifically, cesium ion (Cs+) was used as the primary ion species, the primary ion energy was set to 2.5 keV, and the beam incident angle was set to 67.2°. Under these conditions, MCs+ (M is Al, Ga, In, As, Sb, or the like) with a small matrix effect was detected as the secondary ion species to be detected.

At this time, sputtering was carried out under the above-mentioned conditions and up to the depth of the intended layer for a predetermined period of time to analyze the composition of the target layer. The depth of the target layer can be obtained from the thickness of each layer by cross sectional TEM measurement as described later. For the sputtering time-depth conversion in SIMS analysis, sputtering rate was obtained by measuring the sputtering depth for a certain period of time under the same condition as the analysis by using, for example, a stylus profilometer, and used to convert the sputtering time at the time of sample measurement into depth.

Then, from the signal intensity of MCs+ in each layer, the Al composition was obtained. For example, in the case of an AlInSb layer, the Al composition was obtained from: (signal intensity of AlCs+)/((signal intensity of ACs+)+(signal intensity of InCs+)).

Even if each layer has a uniform composition in the depth direction, the signal intensity sometimes distributes in the depth direction due to the influence of sputtering. In this case, the signal intensity of each layer is represented by the maximum signal intensity.

Note that the quantitative value of the Al composition obtained by the analysis can be accompanied by deviation from the true value. In order to correct this deviation from the true value, a separate sample for which the lattice constant value obtained from the X-ray diffraction (XRD) method had been obtained was prepared, and, using this sample as a standard sample whose Al composition value was already known, SIMS analysis was performed under the measurement conditions for the Al composition of each layer of the first layer, and the sensitivity coefficient of the Al composition with respect to the signal intensity was obtained. The Al composition of each layer of the first layer was obtained by multiplying the SIMS signal intensity in each layer of the first layer by the sensitivity coefficient.

In this case, as a separate sample, $Al_xIn_{1-x}Sb$ having a film thickness of 800 nm stacked on a GaAs substrate was used. With respect to this sample, the lattice constant was obtained by X-ray diffraction (XRD) method using an X-ray diffractometer X'Pert MPD manufactured by Spectris Co., Ltd., as described below, and the Al composition x as a standard specimen was obtained.

By performing 2θ-ω scan by X-ray diffraction, the lattice constant in the direction normal to the substrate surface of the layer containing $Al_xIn_{1-x}Sb$ was obtained from the peak position in the 2θ-ω scan of the plane index of the plane corresponding to the plane orientation of the substrate surface, and the Al composition x was determined from the lattice constant in the normal direction using the Vegard's rule. In this case, it is assumed that there is no anisotropic distortion of the $Al_xIn_{1-x}Sb$ layer. Specifically, the Vegard's rule is represented by:

$$a_{AlInSb} = xa_{AlSb} + (1-x)a_{InSb} \quad \text{Expression (4)}$$

Where $a_{AlSb}$ is the lattice constant of AlSb. $a_{InSb}$ is the lattice constant of InSb. $a_{AlInSb}$ is the lattice constant of $Al_xIn_{1-x}Sb$ obtained by the above-described X-ray diffraction. We used 6.1355 Å for $a_{AlSb}$ and 6.4794 Å for $a_{InSb}$. As a standard sample for SIMS measurement, a sample with 0.10<x<0.15 was used.

The composition of elements other than Al in each layer of the first layer can also be measured by using the same method as described above.

For example, the Ga composition in the case of containing Ga can also be measured by using the same method as described above.

In this case, $Ga_gIn_{1-g}Sb$ having a film thickness of 800 nm stacked on a GaAs substrate is used as a separate sample. Using $Ga_gIn_{1-g}Sb$, the Vegard's rule is specifically expressed by:

$$a_{GaInSb} = ga_{GaSb} + (1-g)a_{InSb} \quad \text{Expression (5)}$$

Where $a_{GaSb}$ is the lattice constant of GaSb. $a_{InSb}$ is the lattice constant of InSb. $a_{GaInSb}$ is the lattice constant of $Al_gIn_{1-g}Sb$ obtained by the above-described X-ray diffraction. We used 6.0959 Å for $a_{GaSb}$ and 6.4794 Å for $a_{InSb}$. As a standard sample for SIMS measurement, a sample with 0.10<g<0.15 was used.

The film thickness of each layer of the first layer can be measured by cross-sectional TEM (Transmission Electron Spectroscopy) method. Specifically, a sample having a thickness of about 500 nm or less was prepared by FIB method using an FIB apparatus (FB-2100) manufactured by Hitachi High-Technologies Corporation, sectional images were observed in transmission images at an acceleration voltage of 200 kV using an STEM apparatus (HD-2300A) manufactured by Hitachi, Ltd., and the thickness of each layer was measured. The film thicknesses of the layers other than the first layer can also be measured by using the same measurement method.

From the viewpoint of applying the stress necessary for bending of line defects, the lower limit of the film thickness $t_{y(1)}$ [nm] of the layer containing $Al_{y(1)}In_{1-y(1)}Sb$ is preferably 2 nm or more, and more preferably 5 nm or more.

In view of the fact that crystals of good quality can be obtained in a ternary or higher mixed crystal as the mixed crystal ratio is smaller, from the viewpoint of provision of crystals of relatively good quality and ease of the device formation process, it is preferable that 0<x(1)<0.25, and more preferable that 0<x(1)<0.18. It is more preferable that 0<x(1)<0.09. x(2) is also preferably in the same ranges.

The first layer may contain As as a group V element. Since it is necessary to irradiate an excessive As element during crystal growth, which would inhibit diffusion of surface atoms during crystal growth and lead to deterioration of crystallinity, the proportion of As atoms with respect to all V group elements is preferably 3% or less.

From the viewpoint of uniformly applying stress to the layer containing $Al_{y(1)}In_{1-y(1)}Sb$, it is preferable that |x(1)−x(2)|<0.10, and more preferable that |x(1)−x(2)|<0.03.

For the film thickness $t_{x(1)}$ of the layer containing $Al_{x(1)}In_{1-x(1)}Sb$, from the viewpoint of absorption of misfit stress, it is preferable that $t_{x(1)} \geq 200$ nm, and more preferable that $t_{x(1)} \geq 300$ nm. The film thickness $t_{x(2)}$ of the layer containing $Al_{x(2)}In_{1-x(2)}Sb$ is also preferably in the same ranges.

From the viewpoints of increase in the film formation time and ease of the device formation process, it is preferable that $t_{x(1)} \leq 700$ nm, and more preferable that $t_{x(1)} \leq 600$ nm. $t_{x(2)}$ is also preferably in the same ranges.

As described above, as the dislocation filter layer $Al_{y(1)}In_{1-y(1)}Sb$ becomes thicker and the lattice constant difference between the dislocation filter layer $Al_{y(1)}In_{1-y(1)}Sb$ and the base material layer $Al_{x(1)}In_{1-x(1)}Sb$ becomes larger, dislocations bend more easily. However, it is not preferable that the dislocation filter layer $Al_{y(1)}In_{1-y(1)}Sb$ is thick as the dislocation filter layer used for the infrared detecting device. The reason is that this would lead to an increase in the film formation time and in the difficulty of the formation process of the infrared detecting device. From the above viewpoint, it is preferable that the dislocation filter layer used for the infrared detecting device has a small film thickness, while ensuring a large lattice constant difference from the base material.

For example, the film thickness $t_{y(1)}$ [nm] is preferably not more than 200 nm, and more preferably not more than 100 nm. Further, it is preferably not more than 6 times, and more preferably not more than 4 times the critical film thickness of the film thickness $t_{y(1)}$ [nm] (see FIG. 5 to be described later).

Here, the critical film thickness is a function of y(1)−x(1), which is given by Expressions (6) to (8) below. The following describes a method of obtaining the critical film thickness hc.

Expression (6) represents a Matthews's equation for the critical film thickness of an intermediate layer having a double heterostructure.

In Expression (6), hc denotes the critical film thickness of $Al_{y(1)}In_{1-y(1)}Sb$ corresponding to the intermediate layer, f denotes the degree of lattice mismatch, ν denotes the Poisson's ratio, b denotes the size of the Burgers vector, α denotes the angle between the direction of the dislocation line and the Burgers vector, and λ denotes the angle formed by the interface between the dislocation filter layer and the buffer layer and the slip plane.

Although these parameters depend on the type of dislocation considered, here we consider a 60° dislocation generally found in a zincblende structure containing AlInSb, with $b=a/\sqrt{2}$, $\cos\alpha=\frac{1}{2}$, and $\cos\lambda=\frac{1}{2}$. By substituting these into Expression (6) and rearranging it, Expression (7) is obtained. 0.35 was chosen as the Poisson ratio herein. As the lattice constant a, the lattice constant of $Al_{y(1)}In_{1-y(1)}Sb$ corresponding to the dislocation filter layer was used.

Figure 5:
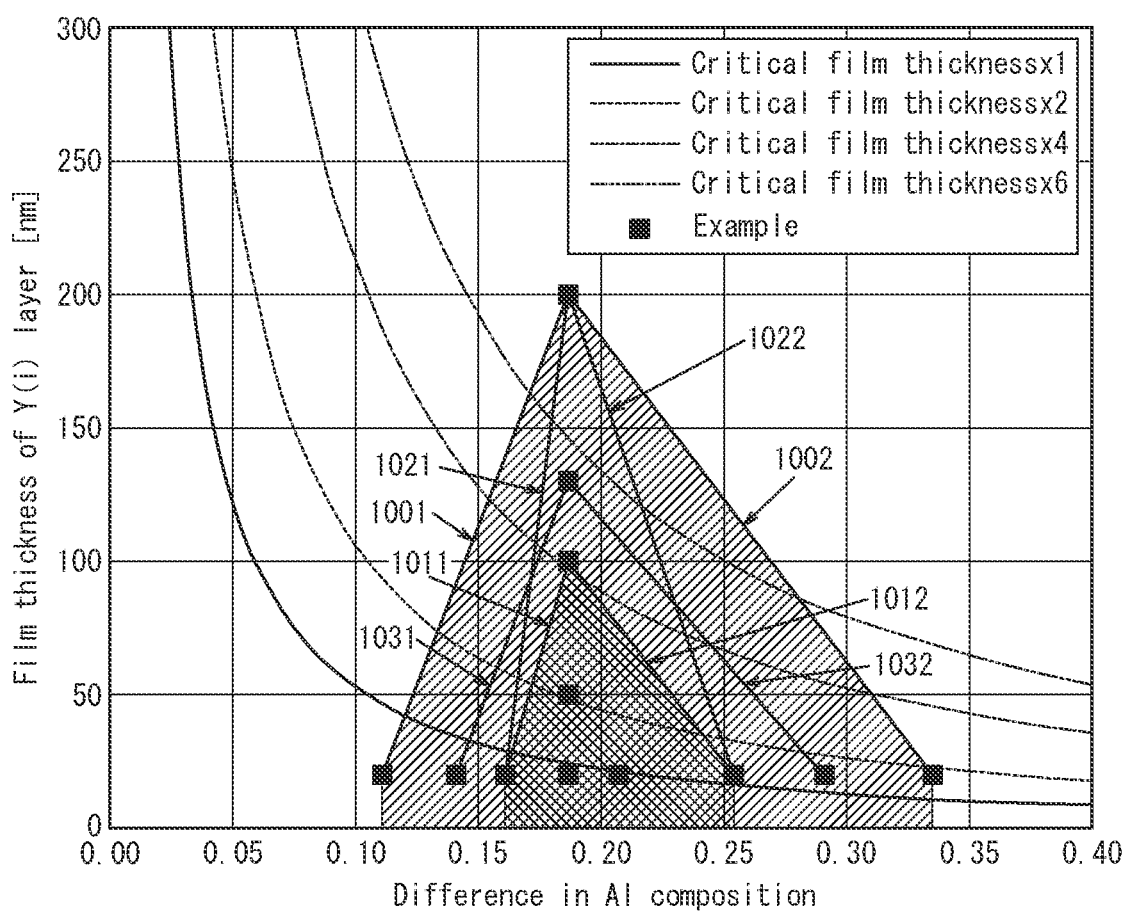
FIG. 5 is a correlation diagram between the Al composition and the critical film thickness.

By using the composition y(1) of $Al_{y(1)}In_{1-y(1)}Sb$ corresponding to the dislocation filter layer and the composition x(1) of $Al_{x(1)}In_{1-x(1)}Sb$ corresponding to the buffer layer, the lattice constant of each layer can be obtained using the Beguard's rule (Expression (4)) and the degree of lattice mismatch f can be obtained (Expression (8)). Through these expressions, the critical film thickness hc can be obtained. The relationship between the difference in Al composition and the critical film thickness hc at this time is illustrated in FIG. 5.

$$h_c = \frac{b}{4\pi f}\frac{(1-v\cos^2\alpha)}{(1+v)\cos\lambda}\left(\ln\frac{h_c}{b}+1\right) \quad \text{Expression (6)}$$

$$h_c = \frac{a}{2\sqrt{2}\pi f}\frac{\left(1-\frac{v}{4}\right)}{(1+v)}\left(\ln\frac{\sqrt{2}h_c}{a}+1\right) \quad \text{Expression (7)}$$

$$f = \frac{|a_{Al_yIn_{1-y}Sb} - a_{Al_xIn_{1-x}Sb}|}{a_{Al_xIn_{1-x}Sb}} \quad \text{Expression (8)}$$

Further, as described later in the EXAMPLES section, $t_{y(1)}$, x(1), x(2), and y(1) for the first layer preferably satisfy the following relations:

$0<t_{y(1)}\leq 6901\times(y(1)-x(1))-1087(0.16\leq y(1)-x(1)\leq 0.19)$, $0<t_{y(1)}\leq -2673\times(y(1)-x(1))+699(0.19<y(1)-x(1)\leq 0.25)$, $0<t_{y(1)}\leq 6901\times(y(1)-x(2))-1087(0.16\leq y(1)-x(2)\leq 0.19)$, and $0<t_{y(1)}\leq -2673\times(y(1)-x(2))+699(0.19<y(1)-x(2)\leq 0.25)$, more preferably:

$0<t_{y(1)}\leq 1993\times(y(1)-x(1))-242(0.13\leq y(1)-x(1)\leq 0.19)$, $0<t_{y(1)}\leq -1040\times(y(1)-x(1))+324(0.19<y(1)-x(1)\leq 0.29)$, $0<t_{y(1)}\leq 1993\times(y(1)-x(2))-242(0.13\leq y(1)-x(2)\leq 0.19)$, and $0<t_{y(1)}\leq -1040\times(y(1)-x(2))+324(0.19<y(1)-x(2)\leq 0.29)$, and still more preferably:

$0<t_{y(1)}\leq 3067\times(y(1)-x(1))-472(0.16\leq y(1)-x(1)\leq 0.19)$, $0<t_{y(1)}\leq -1188\times(y(1)-x(1))+322(0.19<y(1)-x(1)\leq 0.25)$, $0<t_{y(1)}\leq 3067\times(y(1)-x(2))-472(0.16\leq y(1)-x(2)\leq 0.19)$, and $0<t_{y(1)}\leq -1188\times(y(1)-x(2))+322(0.19<y(1)-x(2)\leq 0.25)$.

Further, it is preferable that the first layer has a layered structure in which a layer containing $Al_{x(i)}In_{1-x(i)}Sb$ ($0\leq x(i)\leq 1$) and a layer having a film thickness $t_{y(i)}$ in nanometers and containing $Al_{y(i)}In_{1-y(i)}Sb$ ($0\leq y(i)\leq 1$) are sequentially stacked on top of one another in the stated order in n layers.

In this case, the number of repetitions n is preferably $n\geq 2$, and more preferably $n\geq 3$ from the viewpoint of reducing the line defect density.

From the viewpoints of increase in the film formation time and ease of the device formation process, it is preferable that $n\leq 6$, and more preferable that $n\leq 5$ As described later in the EXAMPLES section, for an integer i from 1 to n ($2\leq n\leq 6$), the first layer comprises: a layered structure in which a layer containing $Al_{x(i)}In_{1-x(i)}Sb$ and a layer having a film thickness $t_{y(i)}$ in nanometers and containing $Al_{y(i)}In_{1-y(i)}Sb$ are sequentially stacked on top of one another in the stated order in n layers; and a layer containing $Al_{x(n+1)}In_{1-x(n+1)}Sb$ directly on the layer having a film thickness $t_{y(n)}$ in nanometers and containing $Al_{y(n)}In_{1-y(n)}Sb$, where $t_{y(i)}$, x(i), x(i+1), and y(i) preferably satisfy the following relations:

$0<t_{y(i)}\leq 2360\times(y(i)-x(i))-240(0.11\leq y(i)-x(i)\leq 0.19)$, $0<t_{y(i)}\leq -1215\times(y(i)-x(i))+427(0.19<y(i)-x(i)\leq 0.33)$, $0<t_{y(i)}\leq 2360\times(y(i)-x(i+1))-240(0.11\leq y(i)-x(i+1)\leq 0.19)$, $0<t_{y(i)}\leq -1215\times(y(i)-x(i+1))+427(0.19<y(i)-x(i+1)\leq 0.33)$, $0<x(i)<0.18$, and $0<x(i+1)<0.18$.

Preferably, $t_{y(i)}$ is in the same ranges as $t_{y(1)}$, while x(i) and x(i+1) in the same ranges as x(1) as described above.

Further, as described later in the EXAMPLES section, $t_{y(i)}$, x(i), x(i+1), and y(i) for the first layer preferably satisfy the following relations:

$0<t_{y(i)}\leq 6901\times(y(i)-x(i))-1087(0.16\leq y(i)-x(i)\leq 0.19)$, $0<t_{y(i)}\leq -2673\times(y(i)-x(i))+699(0.19<y(i)-x(i)\leq 0.25)$, $0<t_{y(i)}\leq 6901\times(y(i)-x(i+1))-1087(0.16\leq y(i)-x(i+1)\leq 0.19)$, and $0<t_{y(i)}\leq -2673\times(y(i)-x(i+1))+699(0.19<y(i)-x(i+1)\leq 0.25)$, more preferably:

$0<t_{y(i)}\leq 1993\times(y(i)-x(i))-242(0.13\leq y(i)-x(i)\leq 0.19)$, $0<t_{y(i)}\leq -1040\times(y(i)-x(i))+324(0.19<y(i)-x(i)\leq 0.29)$, $0<t_{y(i)}\leq 1993\times(y(i)-x(i+1))-242(0.13\leq y(i)-x(i+1)\leq 0.19)$, and $0<t_{y(i)}\leq -1040\times(y(i)-x(i+1))+324(0.19<y(i)-x(i+1)\leq 0.29)$, and still more preferably:

$0<t_{y(i)}\leq 3067\times(y(i)-x(i))-472(0.16\leq y(i)-x(i)\leq 0.19)$, $0<t_{y(i)}\leq -1188\times(y(i)-x(i))+322(0.19<y(i)-x(i)\leq 0.25)$, $0<t_{y(i)}\leq 3067\times(y(i)-x(i+1))-472(0.16\leq y(i)-x(i+1)\leq 0.19)$, and $0 < t_{y(i)} \leq -1188 \times (y(i)-x(i+1))+322(0.19 < y(i)-x(i+1) \leq 0.25)$.

In this case, with respect to $Al_{y(i)}In_{1-y(i)}Sb$ in different layers, the values of the Al composition y(i) may be same or different. Also the values of $t_{y(i)}$ in different layers may be same or different.

As a material of the first layer, for example, it may comprise: a layered structure comprising a layer containing $Al_{x(1)}In_{1-x(1)}Sb$, a layer having a film thickness of $t_{y(1)}$ and containing $Al_{y(1)}In_{1-y(1)}Sb$, and a layer containing $Al_{x(2)}In_{1-x(2)}Sb$ in the stated order; and a single layer of AlAs, GaAs, InAs, AlSb, GaSb, InSb, or InP alone, or a layered structure of a mixed crystal thereof.

In the case where the above-described semiconductor substrate is a GaAs substrate, it is preferable from the viewpoint of ensuring good crystallinity that the first layer comprises a layer in contact with the GaAs substrate, wherein the layer is made of InSb.

The first layer is preferably n- or p-type doped with a donor impurity or an acceptor impurity, but it is not necessarily doped as long as it has a first conductivity type. In the case where the first layer is doped, the doping concentration is preferably $1 \times 10^{18}$ [cm$^{-3}$] or more from the viewpoint of reducing the contact resistance with the metal and $1 \times 10^{19}$ [cm$^{-3}$] or less from the viewpoint of ensuring crystallinity.

The first conductivity type is preferably of n conductivity type from the viewpoint of improvement of infrared transmittance of the infrared detecting device by the Burstein-Moth effect.

In the case where the first layer and the light receiving layer are in direct contact with each other, the material of the layer in contact with the light receiving layer in the first layer preferably has a larger band gap than the light receiving layer from the perspective of suppression of diffusion current.

The light receiving layer in the infrared detecting device according to this embodiment is a layer formed on the first layer. The material of the light receiving layer is not particularly limited as long as it is a compound semiconductor having a band gap corresponding to infrared rays having a wavelength of 2 μm or more. Examples of the material include a single layer of AlAs, GaAs, InAs, AlSb, GaSb, InSb, or InP alone, or a layered structure of a mixed crystal thereof.

In particular, $Al_zIn_{1-z}Sb$ is preferable as a material of the light receiving layer from the viewpoint of provision of crystals of relatively good quality. In this case, the Al composition z is preferably more than 0 and smaller than 0.25 from the viewpoint of being able to respond to wavelengths from 2.0 m to 7.0 μm, and more preferably more than 0 and smaller than 0.18 in particular from the viewpoint that better crystallinity can be obtained with a smaller Al composition z. It is more preferably smaller than 0.09. From the viewpoint of increasing $R_a$ by reducing carrier concentration, it is preferably greater than 0.01, and more preferably greater than 0.02. From the viewpoint of obtaining crystals of good quality, it is preferable that the lattice constant be close to that of the layer containing $Al_{x(1)}In_{1-x(1)}Sb$ in the first layer.

The conductivity type of the light receiving layer may be any one of n type, i type and p type. As for doping, the light receiving layer may be non-doped (that is, it does not contain intentional impurities), or may be n- or p-type doped with a donor impurity or an acceptor impurity.

Further, from the viewpoint of suppression of defective recombination caused by defects, the light receiving layer preferably has a line defect density of $3.0 \times 10^8$ [lines/cm$^2$] or less. The line defect density of the light receiving layer can be measured by observation in plane-view TEM. Specifically, the line defect density can be calculated as follows: a sample is prepared by FIB method using an FIB apparatus (FB-2100) manufactured by Hitachi, Ltd., plane-view TEM image observation is carried out using an STEM apparatus (HD-2300A) manufactured by Hitachi, Ltd., the number of line defects in a continuous visual field over an area of 30 μm$^2$ or more is measured, and the number of line defects per unit area is obtained.

From the viewpoint of sufficient absorption of incident light, the lower limit of the film thickness [nm] of the light receiving layer is preferably 100 nm or more, and more preferably 200 nm or more. Further, from the viewpoints of increase in the film formation time and ease of the device formation process, the upper limit of the film thickness of the light receiving layer is preferably 4000 nm or less, and more preferably 3000 nm or less.

The second layer of the infrared detecting device according to this embodiment is formed on the light receiving layer and has a second conductivity type (any one of n type, i type and p type).

It is preferable that the second layer has a conductivity type opposite to that of the first conductivity type of the first layer. For example, if the first layer is of n type, the second layer is preferably of p type. If the first layer is of p type, the second layer is preferably of n type.

As described above, since it is preferable that the first layer be of n type, the second layer is preferably of p type.

The second layer is preferably n- or p-type doped with a donor impurity or an acceptor impurity, but it is not necessarily doped as long as it has a second conductivity type.

In the case where the second layer is doped, its doping concentration is preferably $1 \times 10^{18}$ [cm$^{-3}$] or more from the viewpoint of reducing the contact resistance with the metal and $1 \times 10^{19}$ [cm$^{-3}$] or less from the viewpoint of ensuring crystallinity.

The material of the second layer is not particularly limited as long as it is a compound semiconductor. Examples of the material include a single layer of AlAs, GaAs, InAs, AlSb, GaSb, InSb, or InP alone, or a layered structure of a mixed crystal thereof.

In the case where the second layer and the light receiving layer are in direct contact with each other, the material of the layer in contact with the light receiving layer in the second layer preferably has a larger band gap than the light receiving layer from the perspective of suppression of diffusion current.

From the viewpoint of preventing damage during the element formation process, the lower limit of the film thickness [nm] of the second layer is preferably 30 nm or more, and more preferably 50 nm or more. The upper limit [nm] of the film thickness of the second layer is preferably 2000 nm or less, and more preferably 1000 nm or less, from the viewpoints of increase in the film formation time and ease of the device formation process.

In an embodiment of the present disclosure, each of the compound semiconductor layers (for example, the first layer, the light receiving layer, and the second layer) can be formed by using various film forming methods. For example, a molecular beam epitaxy (MBE) method or a metal organic vapor phase epitaxy (MOVPE) method is preferable. Each of these methods can be used to form each compound semiconductor layer on a semiconductor substrate. In the step of forming each compound semiconductor layer, the semiconductor substrate may be once taken out from the film forming apparatus into the atmosphere during the formation of each layer constituting the corresponding compound semiconductor layer.

In an embodiment of the present disclosure, the infrared detecting device has the following layered structure.

For an integer i from 1 to n, the first layer 20 comprises a layered structure in which a buffer layer X(i) having a thickness $t_{x(i)}$ and containing $Al_{x(i)}In_{1-x(i)}Sb$ and a dislocation filter layer Y(i) having a thickness $t_{y(i)}$ and containing $Al_{y(i)}In_{1-y(i)}Sb$ are sequentially stacked on top of one another in the stated order in n layers, and a buffer layer X(n+1) having a thickness $t_{x(n+1)}$ and containing $Al_{x(n+1)}In_{1-x(n+1)}Sb$ is stacked directly thereon. As used herein, "sequentially stacked" means that "a Y(i) layer is stacked directly on an X(i) layer, and an X(i+1) layer is stacked directly on the Y(i) layer".

In this case, a Y(i) layer functions as a dislocation filter layer. An X(i) layer functions as a buffer layer to absorb the misfit stress. When a misfit stress is applied to a Y(i) layer, dislocations bend at the interface between an X(i) layer and the Y(i) layer and the interface between the Y(i) layer and an X(i+1) layer.

Therefore, in a Y(i) layer, as the difference in composition from X(i) and X(i+1) layers becomes larger, the misfit stress increases, causing dislocations to bend more easily. On the other hand, if the difference in composition between a Y(i) layer and X(i) and X(i+1) layers is too large, the crystal can not withstand the misfit stress, and conversely dislocations occur.

Further, as the thickness $t_{y(i)}$ of the Y(i) layer becomes larger, the misfit stress increases, causing dislocations to bend more easily. On the other hand, if the thickness $t_{y(i)}$ of the Y(i) layer is too large, the crystal can not withstand the stress when the misfit stress becomes larger than a certain value, and conversely dislocations occur. The difference in composition between the Y(i) layer and the X(i) layer, the difference in composition between the Y(i) layer and the X(i+1) layer, and the thickness $t_{y(i)}$ of the Y(i) layer are not independent from one another, and there are suitable ranges as described above.

The following describes embodiments of the present disclosure with reference to the drawings. However, in the drawings described below, the same reference numerals are given to the corresponding portions, and the description thereof will be omitted as appropriate in the overlapping portions. The embodiments of the present disclosure are merely illustrative of a configuration for embodying the technical idea of the disclosure, but are not intended to limit the material, shape, structure, arrangement, dimension, and the like to those disclosed herein. In addition, the following embodiments include all of the combinations of characteristic configurations described herein. Various modifications can be made to the technical idea of the present disclosure within the technical scope defined by the claims.

Figure 2:
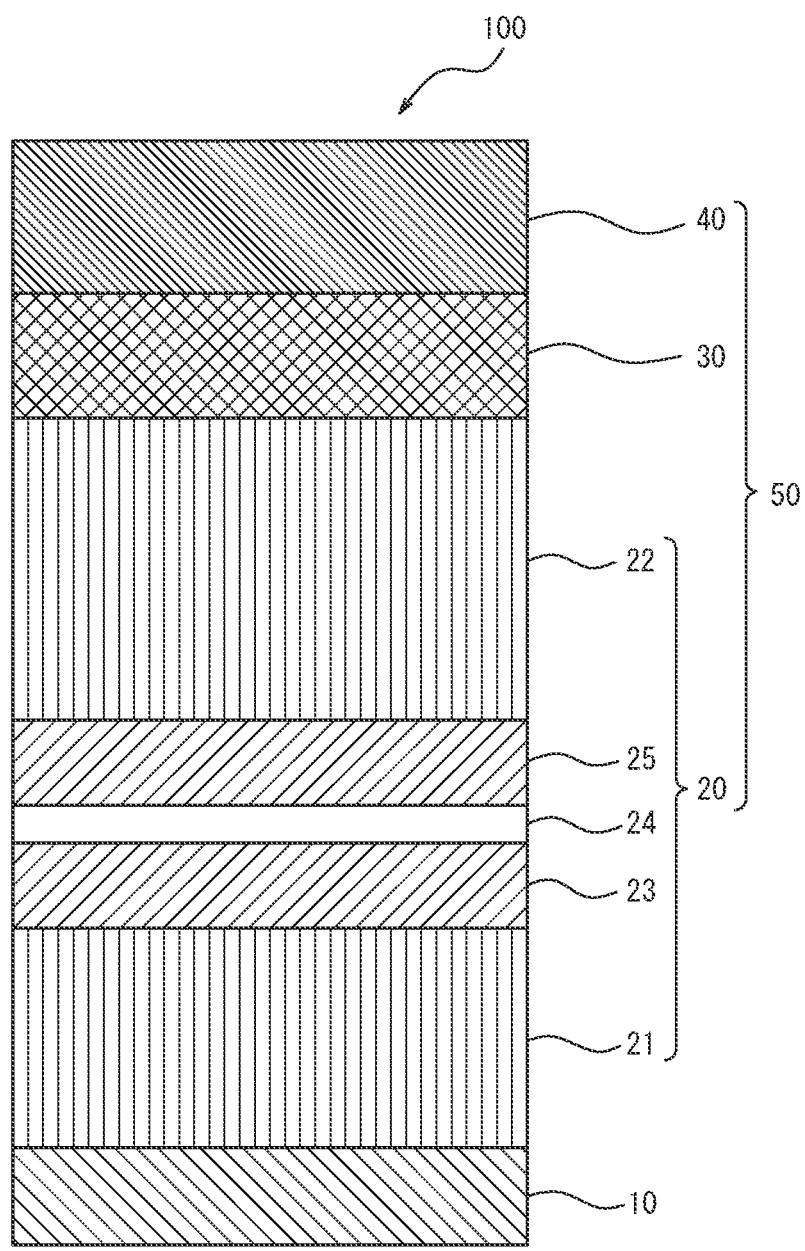
FIG. 2 is a cross-sectional view illustrating a configuration of an infrared detecting device of a first embodiment.

FIG. 2 is a cross-sectional view illustrating the configuration of a first embodiment of an infrared detecting device 100 according to the disclosure. The infrared detecting device 100 has a structure in which a compound semiconductor layer 50 is stacked on a semiconductor substrate 10. The compound semiconductor layer 50 has a structure in which a first layer 20, a light receiving layer 30, and a second layer 40 are stacked on top of one another in the stated order. In the first embodiment, the first layer 20 comprises a buffer layer 23 which is a layer X(1) having a thickness $t_{x(1)}$ and containing $Al_{x(1)}In_{1-x(1)}Sb$. The first layer 20 also comprises a dislocation filter layer 24 which is a layer Y(1) having a thickness $t_{y(1)}$ and containing $Al_{y(1)}In_{1-y(1)}Sb$. The first layer 20 also comprises a buffer layer 25 which is a layer X(2) having a thickness $t_{x(2)}$ and containing $Al_{x(2)}In_{1-x(2)}Sb$. In the first embodiment, the first layer 20 has a structure in which a set of layers, namely a buffer layer 23 and a dislocation filter layer 24, are stacked in the stated order, and the buffer layer 25 is stacked directly thereon.

The first layer 20 further comprises a buffer layer (InSb layer 21) containing InSb and a barrier layer 22. As illustrated in FIG. 2, the first layer 20 has a structure in which the buffer layer 23 is stacked directly on the InSb layer 21. The first layer 20 also has a structure in which the barrier layer 22 is stacked directly on the buffer layer 25.

Figure 3:
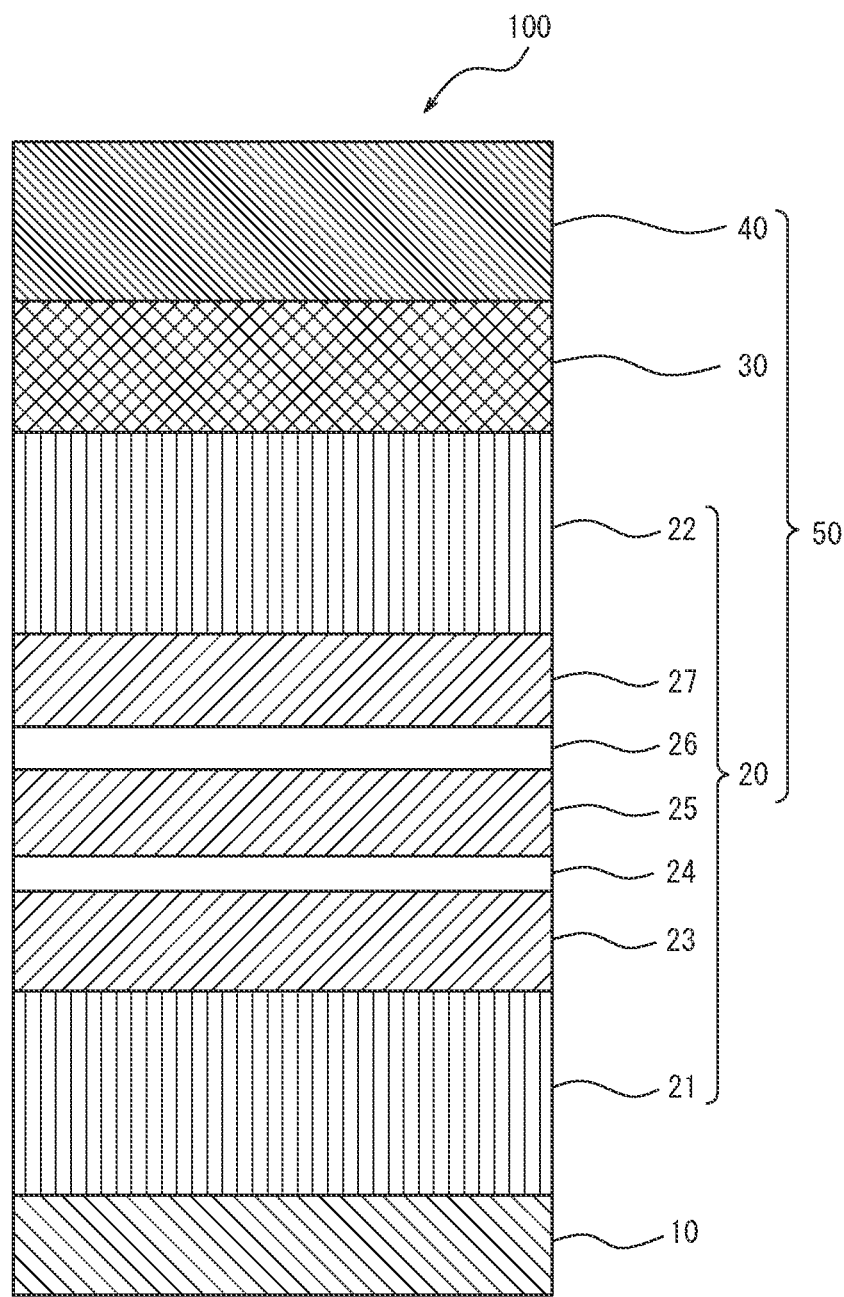
FIG. 3 is a cross-sectional view illustrating a configuration of an infrared detecting device of a second embodiment.

FIG. 3 is a cross-sectional view illustrating the configuration of a second embodiment of the infrared detecting device 100 according to the disclosure. In the second embodiment, the first layer 20 has a structure in which the number of repetitions n for the above-described layered structure is 2. In FIG. 3, the same reference numerals are given to the same elements as those of the first embodiment of the infrared detecting device 100, and the description thereof will be omitted.

In the second embodiment, the first layer 20 comprises a dislocation filter layer 26 which is a layer Y(2) having a thickness $t_{y(2)}$ and containing $Al_{y(2)}In_{1-y(2)}Sb$. The first layer 20 also comprises a buffer layer 27 which is a layer X(3) having a thickness $t_{x(3)}$ and containing $Al_{x(3)}In_{1-x(3)}Sb$. The first layer 20 has a structure in which two sets of layers, namely a buffer layer 23 and a dislocation filter layer 24, and a buffer layer 25 and a dislocation filter layer 26, are sequentially stacked on top of one another in the stated order, and a buffer layer 27 is stacked directly thereon. In the second embodiment, the first layer 20 also has a structure in which a barrier layer 22 is stacked directly on the buffer layer 27.

Figure 4:
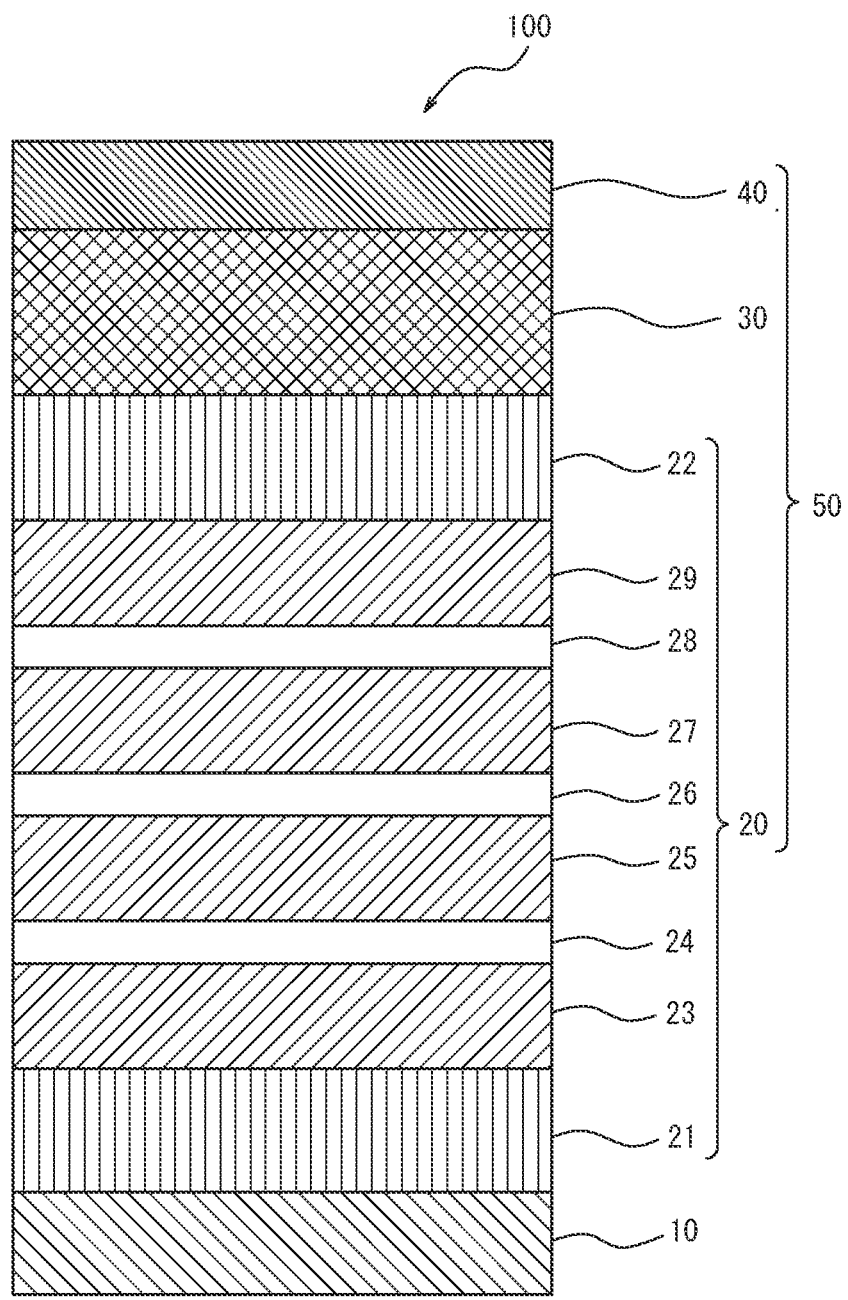
FIG. 4 is a cross-sectional view illustrating a configuration of an infrared detecting device of a third embodiment.

FIG. 4 is a cross-sectional view illustrating the configuration of a third embodiment of the infrared detecting device 100 according to the disclosure. In the third embodiment, the first layer 20 has a structure in which the number of repetitions n for the above-described layered structure is 3. In FIG. 4, the same reference numerals are given to the same elements as those of the second embodiment of the infrared detecting device 100, and the description thereof will be omitted.

In the third embodiment, the first layer 20 comprises a dislocation filter layer 28 which is a layer Y(3) having a thickness $t_{y(3)}$ and containing $Al_{y(3)}In_{1-y(3)}Sb$. The first layer 20 also comprises a buffer layer 29 which is a layer X(4) having a thickness $t_{x(4)}$ and containing $Al_{x(4)}In_{1-x(4)}Sb$. The first layer 20 has a structure in which three sets of layers, namely a buffer layer 23 and a dislocation filter layer 24, a buffer layer 25 and a dislocation filter layer 26, and a buffer layer 27 and a dislocation filter layer 28, are laminated in the stated order, and a buffer layer 29 is stacked directly thereon. In the third embodiment, the first layer 20 also has a structure in which a barrier layer 22 is stacked directly on the buffer layer 29.

Although the first, second, and third embodiments of the present disclosure have been described above, the technical scope of the disclosure is not limited to the scope disclosed herein. For example, the number of repetitions n for the layered structure is not limited to 2 or 3, and may be selected within the range of 4 to 6. It will be readily apparent to those skilled in the art that various modifications or improvements can be added to the above embodiments. It will be appreciated that the claims cover all such modifications or improvements as fall within the technical scope of the present disclosure.

Further, if Ga is used instead of Al, GaSb having a lattice constant close to that of AlSb can be formed and stress can be generated in the layer as described above. Accordingly, another embodiment of the infrared detecting device according to the present disclosure comprises, in the stated order:
 a semiconductor substrate;
 a first layer formed on a semiconductor substrate and having a first conductivity type,
 a light receiving layer formed on the first layer, and
 a second layer formed on the light receiving layer and having a second conductivity type.

The first layer comprises, in the stated order: a layer containing $Al_{x(1)}Ga_{p(1)}In_{1-x(1)-p(1)}Sb$; a layer having a film thickness $t_{y(1)}$ in nanometers and containing $Al_{y(1)}Ga_{q(1)}In_{1-y(1)-q(1)}Sb$; and a layer containing $Al_{x(2)}Ga_{p(2)}In_{1-x(2)-p(2)}Sb$.

These layers may be configured such that $t_{y(1)}$, x(1), x(2), y(1), p(1), p(2), and q(1) satisfy the following relations:

$0<t_{y(1)}\leq 2360\times(y(1)+q(1)-x(1)-p(1))-240(0.11\leq y(1)+q(1)-x(1)-p(1)\leq 0.19)$, $0<t_{y(1)}\leq -1215\times(y(1)+q(1)-x(1)-p(1))+427(0.19<y(1)+q(1)-x(1)-p(1)\leq 0.33)$, $0<t_{y(1)}\leq 2360\times(y(1)+q(1)-x(2)-p(2))-240(0.11\leq y(1)+q(1)-x(2)-p(2)\leq 0.19)$, $0<t_{y(1)}\leq -1215\times(y(1)+q(1)-x(2)-p(2))+427(0.19<y(1)+q(1)-x(2)-p(2)\leq 0.33)$, $0<x(1)+p(1)<0.18$, $0<x(2)+p(2)<0.18$, and $0<q(1)/(y(1)+q(1))\leq 1$.

Also in the infrared detecting device according to this embodiment, the line defect density of the light receiving layer located on the first layer decreases because dislocations, namely line defects, bend in the lateral direction in the first layer. By suppressing defective recombination through dislocations in the light receiving layer, it is possible to improve the $R_a$. This effect was provided as explained later in Examples 21 and 22, for which the $R_a$ was similar to that of the mode in which the base material and the dislocation filter layer contain AlInSb. The preferred embodiments described above with respect to the mode in which the base material and the dislocation filter layer contain AlInSb are also applicable to the infrared detecting device according to this embodiment by replacing "the Al composition" with "the sum of the Al composition and the Ga composition".

EXAMPLES

The present disclosure is described in detail below based on examples. However, this disclosure is not limited to the following examples. Of course, various modifications are possible without departing from the gist of the disclosure.

In Example 1, as illustrated in FIG. 3, for example, the following layers were stacked in the stated order on a semi-insulating GaAs substrate (a semiconductor substrate 10) using an MBE apparatus to form a compound semiconductor layer 50:
 an n-type InSb layer 21 doped with Sn at $7\times 10^{18}$ [cm$^{-3}$] to a thickness of 0.5 μm;
 an n-type $Al_{0.08}In_{0.92}Sb$ layer (a buffer layer 23) doped with Sn at $7\times 10^{18}$ [cm$^{-3}$] to a thickness of 0.5 μm;
 an n-type $Al_{0.27}In_{0.73}Sb$ layer (a dislocation filter layer 24) doped with Sn at $7\times 10^{18}$ [cm$^{-3}$] to a thickness of 0.02 μm;
 an n-type $Al_{0.08}In_{0.92}Sb$ layer (a buffer layer 25) doped with Sn at $7\times 10^{18}$ [cm$^{-3}$] to a thickness of 0.5 μm;
 an n-type $Al_{0.27}In_{0.73}Sb$ layer (a dislocation filter layer 26) doped with Sn at $7\times 10^{18}$ [cm$^{-3}$] to a thickness of 0.02 μm;
 an n-type $Al_{0.08}In_{0.92}Sb$ layer (a buffer layer 27) doped with Sn at $7\times 10^{18}$ [cm$^{-3}$] to a thickness of 0.5 μm;
 an n-type $Al_{0.27}In_{0.73}Sb$ layer (a barrier layer 22) doped with Sn at $7\times 10^{18}$ [cm$^{-3}$] to a thickness of 0.02 μm;
 a non-doped $Al_{0.08}In_{0.92}Sb$ layer (a light receiving layer 30) to a thickness of 1 μm;
 a p-type $1_{0.27}In_{0.73}Sb$ layer (a barrier layer constituting a second layer 40) doped with Zn at $3\times 10^{18}$ [cm$^{-3}$] to a thickness of 0.02 μm; and
 a p-type $Al_{0.08}In_{0.92}Sb$ layer (a p layer constituting the second layer 40) doped with Zn at $3\times 10^{18}$ [cm$^{-3}$] to a thickness of 0.5 μm.

Next, a resist pattern was formed on the compound semiconductor layer 50, and etching was performed to fabricate a mesa structure. Further, insulating grooves made of silicon oxide were formed between the mesa structures such that the respective light detecting devices were electrically independent, and silicon nitride was formed as an insulating layer on the entire surface of the compound semiconductor layer 50 including the mesa structure and an insulating trench. A contact hole was formed in a part of the insulating layer, and titanium (Ti), platinum (Pt), and gold (Au) were deposited in the stated order so as to cover the contact hole to form an electrode portion, whereby an infrared detecting device in which a plurality of diodes having a mesa structure of the same area and the same perimeter were connected in series was obtained. With a similar method, a plurality of infrared detecting devices, in which a plurality of diodes having a mesa structure of the same area and the same perimeter were connected in series, were prepared independently so that the area and perimeter of the mesa structure for each one of the infrared detecting devices were different from each other.

A measurement specimen was prepared from 0.3 μm on the side closer to the p layer constituting the second layer 40 in the light receiving layer 30 and the line defect density was observed in plane-view TEM. The line defect density was determined to be $1.1\times 10^8$ [lines/cm$^2$]. It is understood that the defect density is reduced as compared with the comparative examples described later.

For Examples 2 to 12, and 18 to 20, parameters were varied as presented in Tables 1 and 2, such as the Al composition y(i) of the dislocation filter layer 24 (Y(1) layer) and the dislocation filter layer 26 (Y(2) layer).

For Examples 13 and 14, parameters were varied as presented in Table 2, such as the Al composition z of the light receiving layer 30 and the Al composition of the buffer layers 23 (X(1) layer), 25 (X(2) layer), and 27 (X(3) layer). The Al composition of the barrier layer was 0.26.

For Example 15, parameters were varied as presented in Table 2, such as the Al composition z of the light receiving layer 30 and the Al composition of the buffer layers 23 (X(1) layer), 25 (X(2) layer), and 27 (X(3) layer). The Al composition of the barrier layer was set to 0.33.

In Example 16, as illustrated in FIG. 2, for example, the following layers were stacked in the stated order on a semi-insulating GaAs substrate (a semiconductor substrate 10) using an MBE apparatus to form a compound semiconductor layer 50:
 an n-type InSb layer 21 doped with Sn at $7\times 10^{18}$ [cm$^{-3}$] to a thickness of 0.5 μm;
 an n-type $Al_{0.08}In_{0.92}Sb$ layer (a buffer layer 23) doped with Sn at $7\times 10^{18}$ [cm$^{-3}$] to a thickness of 0.75 μm;

an n-type $Al_{0.27}In_{0.73}Sb$ layer (a dislocation filter layer 24) doped with Sn at $7\times10^{18}$ [$cm^{-3}$] to a thickness of 0.02 µm;

an n-type $Al_{0.08}In_{0.92}Sb$ layer (a buffer layer 25) doped with Sn at $7\times10^{18}$ [$cm^{-3}$] to a thickness of 0.75 µm;

an n-type $Al_{0.27}In_{0.73}Sb$ layer (a barrier layer 22) doped with Sn at $7\times10^{18}$ [$cm^{-3}$] to a thickness of 0.02 µm;

a non-doped $Al_{0.08}In_{0.92}Sb$ layer (a light receiving layer 30) to a thickness of 1 µm;

a p-type $1_{0.27}In_{0.73}Sb$ layer (a barrier layer constituting a second layer 40) doped with Zn at $3\times10^{18}$ [$cm^{-3}$] to a thickness of 0.02 µm; and a p-type $Al_{0.08}In_{0.92}Sb$ layer (a p layer constituting a second layer 40) doped with Zn at $3\times10^{18}$ [$cm^{-3}$] to a thickness of 0.5 µm.

In this case, the number of repetitions n was 1 for the layered structure in which the layer containing $Al_{x(i)}In_{1-x(i)}Sb$ (0<x(i)<1) and the layer having a film thickness of $t_{y(i)}$ in nanometers and containing $Al_{y(i)}In_{1-y(i)}Sb$ (0<y(i)<1) were stacked.

Then, a resist pattern was formed on the compound semiconductor layer 50, and etching was performed to fabricate a mesa structure. Further, insulating grooves made of silicon oxide were formed between the mesa structures such that the respective light detecting devices were electrically independent, and silicon nitride was formed as an insulating layer on the entire surface of the compound semiconductor layer 50 including the mesa structure and an insulating trench. A contact hole was formed in a part of the insulating layer, and titanium (Ti), platinum (Pt), and gold (Au) were deposited in the stated order so as to cover the contact hole to form an electrode portion, whereby an infrared detecting device in which a plurality of diodes having a mesa structure of the same area and the same perimeter were connected in series was obtained. With a similar method, a plurality of infrared detecting devices, in which a plurality of diodes having a mesa structure of the same area and the same perimeter were connected in series, were prepared independently so that the area and perimeter of the mesa structure for each one of the infrared detecting devices were different from each other.

In Example 17, as illustrated in FIG. 4, for example, the following layers were stacked in the stated order on a semi-insulating GaAs substrate (semiconductor substrate 10) using an MBE apparatus to form a compound semiconductor layer 50:

an n-type InSb layer 21 doped with Sn at $7\times10^{18}$ [$cm^{-3}$] to a thickness of 0.5 µm;

an n-type $Al_{0.08}In_{0.92}Sb$ layer (a buffer layer 23) doped with Sn at $7\times10^{18}$ [$cm^{-3}$] to a thickness of 0.5 µm;

an n-type $Al_{0.27}In_{0.73}Sb$ layer (a dislocation filter layer 24) doped with Sn at $7\times10^{18}$ [$cm^{-3}$] to a thickness of 0.02 µm;

an n-type $Al_{0.08}In_{0.92}Sb$ layer (a buffer layer 25) doped with Sn at $7\times10^{18}$ [$cm^{-3}$] to a thickness of 0.333 µm;

an n-type $Al_{0.27}In_{0.73}Sb$ layer (a dislocation filter layer 26) doped with Sn at $7\times10^{18}$ [$cm^{-3}$] to a thickness of 0.02 µm;

an n-type $Al_{0.08}In_{0.92}Sb$ layer (a buffer layer 27) doped with Sn at $7\times10^{18}$ [$cm^{-3}$] to a thickness of 0.333 µm;

an n-type $Al_{0.27}In_{0.73}Sb$ layer (a dislocation filter layer 28) doped with Sn at $7\times10^{18}$ [$cm^{-3}$] to a thickness of 0.02 µm;

an n-type $Al_{0.08}In_{0.92}Sb$ layer (a buffer layer 29) doped with Sn at $7\times10^{18}$ [$cm^{-3}$] to a thickness of 0.333 µm;

an n-type $Al_{0.27}In_{0.73}Sb$ layer (a barrier layer 22) doped with Sn at $7\times10^{18}$ [$cm^{-3}$] to a thickness of 0.02 µm;

a non-doped $Al_{0.08}In_{0.92}Sb$ layer (a light receiving layer 30) to a thickness of 1 µm;

a p-type $1_{0.27}In_{0.73}Sb$ layer (a barrier layer constituting a second layer 40) doped with Zn at $3\times10^{18}$ [$cm^{-3}$] to a thickness of 0.02 µm; and a p-type $Al_{0.08}In_{0.92}Sb$ layer (a p layer constituting a second layer 40) doped with Zn at $3\times10^{18}$ [$cm^{-3}$] to a thickness of 0.5 µm.

In this case, the number of repetitions n was 3 for the layered structure in which the layer containing $Al_{x(1)}In_{1-x(i)}Sb$ (0<x(1)<1) and the layer having a film thickness of $t_{y(i)}$ in nanometers and containing $Al_{y(i)}In_{1-y(i)}Sb$ (0<y(i)<1) were stacked.

Then, a resist pattern was formed on the compound semiconductor layer 50, and etching was performed to fabricate a mesa structure. Further, insulating grooves made of silicon oxide were formed between the mesa structures such that the respective light detecting devices were electrically independent, and silicon nitride was formed as an insulating layer on the entire surface of the compound semiconductor layer 50 including the mesa structure and an insulating trench. A contact hole was formed in a part of the insulating layer, and titanium (Ti), platinum (Pt), and gold (Au) were deposited in the stated order so as to cover the contact hole to form an electrode portion, whereby an infrared detecting device in which a plurality of diodes having a mesa structure of the same area and the same perimeter were connected in series was obtained. With a similar method, a plurality of infrared detecting devices, in which a plurality of diodes having a mesa structure of the same area and the same perimeter were connected in series, were prepared independently so that the area and perimeter of the mesa structure for each one of the infrared detecting devices were different from each other.

In Example 21, as illustrated in FIG. 3, for example, the following layers were stacked in the stated order on a semi-insulating GaAs substrate (a semiconductor substrate 10) using an MBE apparatus to form a compound semiconductor layer 50:

an n-type InSb layer 21 doped with Sn at $7\times10^{18}$ [$cm^{-3}$] to a thickness of 0.5 µm;

an n-type $Al_{0.08}In_{0.92}Sb$ layer (a buffer layer 23) doped with Sn at $7\times10^{18}$ [$cm^{-3}$] to a thickness of 0.5 µm;

an n-type $Ga_{0.27}In_{0.73}Sb$ layer (a dislocation filter layer 24) doped with Sn at $7\times10^{18}$ [$cm^{-3}$] to a thickness of 0.02 µm;

an n-type $Al_{0.08}In_{0.92}Sb$ layer (a buffer layer 25) doped with Sn at $7\times10^{18}$ [$cm^{-3}$] to a thickness of 0.5 µm;

an n-type $Ga_{0.27}In_{0.73}Sb$ layer (a dislocation filter layer 26) doped with Sn at $7\times10^{18}$ [$cm^{-3}$] to a thickness of 0.02 µm;

an n-type $Al_{0.08}In_{0.92}Sb$ layer (a buffer layer 27) doped with Sn at $7\times10^{18}$ [$cm^{-3}$] to a thickness of 0.5 µm;

an n-type $Al_{0.27}In_{0.73}Sb$ layer (a barrier layer 22) doped with Sn at $7\times10^{18}$ [$cm^{-3}$] to a thickness of 0.02 µm;

a non-doped $Al_{0.08}In_{0.92}Sb$ layer (a light receiving layer 30) to a thickness of 1 µm;

a p-type $1_{0.27}In_{0.73}Sb$ layer (a barrier layer constituting a second layer 40) doped with Zn at $3\times10^{18}$ [$cm^{-3}$] to a thickness of 0.02 µm; and a p-type $Al_{0.08}In_{0.92}Sb$ layer (a p layer constituting a second layer 40) doped with Zn at $3\times10^{18}$ [$cm^{-3}$] to a thickness of 0.5 µm.

Then, a resist pattern was formed on the compound semiconductor layer 50, and etching was performed to fabricate a mesa structure. Further, insulating grooves made of silicon oxide were formed between the mesa structures such that the respective light detecting devices were electrically independent, and silicon nitride was formed as an insulating layer on the entire surface of the compound semiconductor layer 50 including the mesa structure and an insulating trench. A contact hole was formed in a part of the insulating layer, and titanium (Ti), platinum (Pt), and gold (Au) were deposited in the stated order so as to cover the contact hole to form an electrode portion, whereby an infrared detecting device in which a plurality of diodes having a mesa structure of the same area and the same perimeter were connected in series was obtained. With a similar method, a plurality of infrared detecting devices, in which a plurality of diodes having a mesa structure of the same area and the same perimeter were connected in series, were prepared independently so that the area and perimeter of the mesa structure for each one of the infrared detecting devices were different from each other.

In Example 22, as illustrated in FIG. 3, for example, the following layers were stacked in the stated order on a semi-insulating GaAs substrate (a semiconductor substrate 10) using an MBE apparatus to form a compound semiconductor layer 50:

an n-type InSb layer 21 doped with Sn at $7 \times 10^{18}$ [cm$^{-3}$] to a thickness of 0.5 µm;

an n-type $Al_{0.08}In_{0.92}Sb$ layer (a buffer layer 23) doped with Sn at $7 \times 10^{18}$ [cm$^{-3}$] to a thickness of 0.5 µm;

an n-type $Al_{0.13}Ga_{0.14}In_{0.73}Sb$ layer (a dislocation filter layer 24) doped with Sn at $7 \times 10^{18}$ [cm$^{-3}$] to a thickness of 0.02 µm;

an n-type $Al_{0.08}In_{0.92}Sb$ layer (a buffer layer 25) doped with Sn at $7 \times 10^{18}$ [cm$^{-3}$] to a thickness of 0.5 µm;

an n-type $Al_{0.13}Ga_{0.14}In_{0.73}Sb$ layer (a dislocation filter layer 26) doped with Sn at $7 \times 10^{18}$ [cm$^{-3}$] to a thickness of 0.02 µm;

an n-type $Al_{0.08}In_{0.92}Sb$ layer (a buffer layer 27) doped with Sn at $7 \times 10^{18}$ [cm$^{-3}$] to a thickness of 0.5 µm;

an n-type $Al_{0.27}In_{0.73}Sb$ layer (a barrier layer 22) doped with Sn at $7 \times 10^{18}$ [cm$^{-3}$] to a thickness of 0.02 µm;

a non-doped $Al_{0.08}In_{0.92}Sb$ layer (a light receiving layer 30) to a thickness of 1 µm;

a p-type $1_{0.27}In_{0.73}Sb$ layer (a barrier layer constituting a second layer 40) doped with Zn at $3 \times 10^{18}$ [cm$^{-3}$] to a thickness of 0.02 µm; and a p-type $Al_{0.08}In_{0.92}Sb$ layer (a p layer constituting a second layer 40) doped with Zn at $3 \times 10^{18}$ [cm$^{-3}$] to a thickness of 0.5 µm.

Then, a resist pattern was formed on the compound semiconductor layer 50, and etching was performed to fabricate a mesa structure. Further, insulating grooves made of silicon oxide were formed between the mesa structures such that the respective light detecting devices were electrically independent, and silicon nitride was formed as an insulating layer on the entire surface of the compound semiconductor layer 50 including the mesa structure and an insulating trench. A contact hole was formed in a part of the insulating layer, and titanium (Ti), platinum (Pt), and gold (Au) were deposited in the stated order so as to cover the contact hole to form an electrode portion, whereby an infrared detecting device in which a plurality of diodes having a mesa structure of the same area and the same perimeter were connected in series was obtained. With a similar method, a plurality of infrared detecting devices, in which a plurality of diodes having a mesa structure of the same area and the same perimeter were connected in series, were prepared independently so that the area and perimeter of the mesa structure for each one of the infrared detecting devices were different from each other.

TABLE 1

| | Buffer layer (X(i) layer) Al composition x(i) | Dislocation filter layer (Y(i) layer) Al composition y(i) | Dislocation filter layer (Y(i) layer) Ga composition g(i) | Dislocation filter layer (Y(i) layer) Al composition – Ga composition y(i) + g(i) | Difference in Al composition y(i) – x(i) | Difference in Al + Ga composition y(i) + g(i) – x(i) |
|---|---|---|---|---|---|---|
| Example 1 | 0.08 | 0.27 | 0.00 | 0.27 | 0.19 | 0.19 |
| Example 2 | 0.08 | 0.19 | 0.00 | 0.19 | 0.11 | 0.11 |
| Example 3 | 0.08 | 0.24 | 0.00 | 0.24 | 0.16 | 0.16 |
| Example 4 | 0.08 | 0.29 | 0.00 | 0.29 | 0.21 | 0.21 |
| Example 5 | 0.08 | 0.33 | 0.00 | 0.33 | 0.25 | 0.25 |
| Example 6 | 0.08 | 0.41 | 0.00 | 0.41 | 0.33 | 0.33 |
| Example 7 | 0.08 | 0.27 | 0.00 | 0.27 | 0.19 | 0.19 |
| Example 8 | 0.08 | 0.27 | 0.00 | 0.27 | 0.19 | 0.19 |
| Example 9 | 0.08 | 0.27 | 0.00 | 0.27 | 0.19 | 0.19 |
| Example 10 | 0.08 | 0.27 | 0.00 | 0.27 | 0.19 | 0.19 |
| Example 11 | 0.08 | 0.27 | 0.00 | 0.27 | 0.19 | 0.19 |
| Example 12 | 0.08 | 0.27 | 0.00 | 0.27 | 0.19 | 0.19 |

| | Light receiving layer Al composition z | Buffer layer 23 (X(1) layer) Thickness [nm] | Buffer layer 25, 27, 29 (X(2, 3, 4) layer) Thickness [nm] | Dislocation filter layer (Y(i) layer) Thickness [nm] | Number of repetitions n | Ra (relative to comparative example represented by 1) |
|---|---|---|---|---|---|---|
| Example 1 | 0.08 | 500 | 500 | 20 | 2 | 6.4 |
| Example 2 | 0.08 | 500 | 500 | 20 | 2 | 3.4 |
| Example 3 | 0.08 | 500 | 500 | 20 | 2 | 5.2 |
| Example 4 | 0.08 | 500 | 500 | 20 | 2 | 8.3 |
| Example 5 | 0.08 | 500 | 500 | 20 | 2 | 8.2 |
| Example 6 | 0.08 | 500 | 500 | 20 | 2 | 3.4 |
| Example 7 | 0.08 | 500 | 500 | 50 | 2 | 7.5 |
| Example 8 | 0.08 | 500 | 500 | 100 | 2 | 6.2 |
| Example 9 | 0.08 | 500 | 500 | 200 | 2 | 4.6 |
| Example 10 | 0.08 | 500 | 200 | 20 | 2 | 5.6 |

TABLE 1-continued

| | | | | | | |
|---|---|---|---|---|---|---|
| Example 11 | 0.08 | 500 | 300 | 20 | 2 | 5.8 |
| Example 12 | 0.08 | 500 | 400 | 20 | 2 | 6.6 |

TABLE 2

| | Buffer layer (X(i) layer) Al composition x(i) | Dislocation filter layer (Y(i) layer) Al composition y(i) | Dislocation filter layer (Y(i) layer) Ga composition g(i) | Dislocation filter layer (Y(i) layer) Al composition + Ga composition y(i) + g(i) | Difference in Al composition y(i) − x(i) | Difference in Al + Ga composition y(i) + g(i) − x(i) |
|---|---|---|---|---|---|---|
| Comparative Example 1 | 0.08 | — | 0.00 | — | — | — |
| Example 13 | 0.04 | 0.26 | 0.00 | 0.26 | 0.22 | 0.22 |
| Example 14 | 0.04 | 0.21 | 0.00 | 0.21 | 0.17 | 0.17 |
| Comparative Example 2 | 0.04 | — | — | — | — | — |
| Example 15 | 0.13 | 0.33 | 0.00 | 0.33 | 0.20 | 0.20 |
| Comparative Example 3 | 0.13 | — | — | — | — | — |
| Example 16 | 0.08 | 0.27 | 0.00 | 0.27 | 0.19 | 0.19 |
| Example 17 | 0.08 | 0.27 | 0.00 | 0.27 | 0.19 | 0.19 |
| Example 18 | 0.08 | 0.21 | 0.00 | 0.21 | 0.13 | 0.13 |
| Example 19 | 0.08 | 0.27 | 0.00 | 0.27 | 0.19 | 0.19 |
| Example 20 | 0.08 | 0.37 | 0.00 | 0.37 | 0.29 | 0.29 |
| Example 21 | 0.08 | 0.00 | 0.27 | 0.27 | 0.29 | 0.19 |
| Example 22 | 0.08 | 0.13 | 0.14 | 0.27 | 0.29 | 0.19 |

| | Light receiving layer Al composition z | Buffer layer 23 (X(1) layer) Thickness [nm] | Buffer layer 25, 27, 29 (X(2, 3, 4) layer) Thickness [nm] | Dislocation filter layer (Y(i) layer) Thickness [nm] | Number of repetitions n | Ra (relative to comparative example represented by 1) |
|---|---|---|---|---|---|---|
| Comparative Example 1 | 0.08 | 500 | — | — | — | 1.0 |
| Example 13 | 0.04 | 500 | 500 | 20 | 2 | (3.6) |
| Example 14 | 0.04 | 500 | 500 | 20 | 2 | (2.6) |
| Comparative Example 2 | 0.04 | 500 | — | — | — | (1.0) |
| Example 15 | 0.13 | 500 | 500 | 20 | 2 | <5.0> |
| Comparative Example 3 | 0.13 | 500 | — | — | — | <1.0> |
| Example 16 | 0.08 | 750 | 750 | 20 | 1 | 4.1 |
| Example 17 | 0.08 | 500 | 333 | 20 | 3 | 6.9 |
| Example 18 | 0.08 | 500 | 500 | 20 | 2 | 5.0 |
| Example 19 | 0.08 | 500 | 500 | 130 | 2 | 5.0 |
| Example 20 | 0.08 | 500 | 500 | 20 | 2 | 5.0 |
| Example 21 | 0.08 | 500 | 500 | 20 | 2 | 6.3 |
| Example 22 | 0.08 | 500 | 500 | 20 | 2 | 6.4 |

Each comparative example had a double barrier structure. In Comparative Example 1, the following layers were stacked in the stated order on a semi-insulating GaAs substrate (a semiconductor substrate 10) to form a structure corresponding to a compound semiconductor layer 50:

- an n-type InSb layer 21 doped with Sn at $7 \times 10^{18}$ [cm$^{-3}$] to a thickness of 0.5 μm;
- an n-type $Al_{0.08}In_{0.92}Sb$ layer (corresponding to a buffer layer 23) doped with Sn at $7 \times 10^{18}$ [cm$^{-3}$] to a thickness of 0.5 μm;
- an n-type $Al_{0.27}In_{0.73}Sb$ layer (corresponding to a barrier layer 22) doped with Sn at $7 \times 10^{18}$ [cm$^{-3}$] to a thickness of 0.02 μm;
- a non-doped $Al_{0.08}In_{0.92}Sb$ layer (corresponding to a light receiving layer 30) to a thickness of 2 μm;
- a p-type $1_{0.27}In_{0.73}Sb$ layer (corresponding to a barrier layer constituting a second layer 40) doped with Zn at $3 \times 10^{18}$ [cm$^{-3}$] to a thickness of 0.02 μm; and
- a p-type $Al_{0.08}In_{0.92}Sb$ layer (corresponding to a p layer constituting a second layer 40) doped with Zn at $3 \times 10^{18}$ [cm$^{-3}$] to a thickness of 0.5 μm.

Each comparative example had a double barrier structure. In Comparative Example 2, the following layers were stacked in the stated order on a semi-insulating GaAs substrate (a semiconductor substrate 10) to form a structure corresponding to a compound semiconductor layer 50:

- an n-type InSb layer 21 doped with Sn at $7 \times 10^{18}$ [cm$^{-3}$] to a thickness of 0.5 μm;
- an n-type $Al_{0.04}In_{0.96}Sb$ layer (corresponding to a buffer layer 23) doped with Sn at $7 \times 10^{18}$ [cm$^{-3}$] to a thickness of 0.5 μm;
- an n-type $Al_{0.26}In_{0.74}Sb$ layer (corresponding to a barrier layer 22) doped with Sn at $7 \times 10^{18}$ [cm$^{-3}$] to a thickness of 0.02 μm;
- a non-doped $Al_{0.04}In_{0.96}Sb$ layer (corresponding to a light receiving layer 30) to a thickness of 2 μm;

a p-type $1_{0.26}In_{0.74}Sb$ layer (corresponding to a barrier layer constituting a second layer 40) doped with Zn at $3\times10^{18}$ [cm$^{-3}$] to a thickness of 0.02 µm; and a p-type $Al_{0.04}In_{0.96}Sb$ layer (corresponding to a p layer constituting a second layer 40) doped with Zn at $3\times10^{18}$ [cm$^{-3}$] to a thickness of 0.5 µm.

Each comparative example had a double barrier structure. In Comparative Example 3, the following layers were stacked in the stated order on a semi-insulating GaAs substrate (a semiconductor substrate 10) to form a structure corresponding to a compound semiconductor layer 50:

an n-type InSb layer 21 doped with Sn at $7\times10^{18}$ [cm$^{-3}$] to a thickness of 0.5 µm;

an n-type $Al_{0.13}In_{0.87}Sb$ layer (corresponding to a buffer layer 23) doped with Sn at $7\times10^{18}$ [cm$^{-3}$] to a thickness of 0.5 µm;

an n-type $Al_{0.33}In_{0.67}Sb$ layer (corresponding to a barrier layer 22) doped with Sn at $7\times10^{18}$ [cm$^{-3}$] to a thickness of 0.02 µm;

a non-doped $Al_{0.13}In_{0.87}Sb$ layer (corresponding to a light receiving layer 30) to a thickness of 2 µm;

a p-type $1_{0.33}In_{0.67}Sb$ layer (corresponding to a barrier layer constituting a second layer 40) doped with Zn at $3\times10^{18}$ [cm$^{-3}$] to a thickness of 0.02 µm; and a p-type $Al_{0.13}In_{0.87}Sb$ layer (corresponding to a p layer constituting a second layer 40) doped with Zn at $3\times10^{18}$ [cm$^{-3}$] to a thickness of 0.5 m.

For Comparative Example 1, a measurement specimen was prepared from 0.3 µm on the side closer to the p layer in the light receiving layer and the line defect density was observed in plane-view TEM. The line defect density was determined to be $3.5\times10^{8}$ [lines/cm$^{2}$].

The $R_a$, the resistivity against the current through the interior of the infrared detecting device per area of the mesa structure, for the infrared detecting devices formed in Examples 1-22 and Comparative Examples 1-3 was measured and comparison was performed. Specifically, for the plurality of infrared detecting devices in which the area and perimeter of the formed mesa structure were different, the current value passing through when a voltage of 5 nV was applied in the forward direction was measured, then the current value passing through when a voltage of 5 nV was applied in the reverse direction was measured, and it was confirmed that the absolute values of the two current values did not contain a difference of 10% or more from each other. The device resistivity in the case of forward direction and the device resistivity in the case of reverse direction were obtained on the basis of these current values, and the average value was divided by the number of the connected diodes to obtain the device resistivity $R_0$ per diode. $R_a$ was determined from the intercept of $1/(R_0 \cdot S)$ versus L/S plot, with the $R_0$ obtained for each diode of different size and perimeter and the mesa area S and perimeter L of each device. The $R_a$ obtained is listed in Tables 1 and 2. In this case, the $R_a$ of the infrared detecting device formed in Comparative Example 1 is taken as 1.

In the structures of Examples 1-12 and 18-20, each including the dislocation filter layer and for which $t_{y(i)}$, y(i), x(i), and x(i+1) satisfy the following relational expressions (A)-(D), it was found that it is possible to obtain a $R_a$ which is at least 3.0 times larger than that of the structure of Comparative Example 1.

$0<t_{y(i)}\leq 2360\times(y(i)-x(i))-240(0.11\leq y(i)-x(i)\leq 0.19)$ Expression (A)

$0<t_{y(i)}\leq -1215\times(y(i)-x(i))+427(0.19<y(i)-x(i)\leq 0.33)$ Expression (B)

$0<t_{y(i)}\leq 2360\times(y(i)-x(i+1))-240(0.11\leq y(i)-x(i+1)\leq 0.19)$ Expression (C)

$0<t_{y(i)}\leq -1215\times(y(i)-x(i+1))+427(0.19<y(i)-x(i+1)\leq 0.33)$ Expression (D)

FIG. 1 illustrates the relationship between the composition and the film thickness and the line defect density for Examples 1-9 and 18-20. The horizontal axis in FIG. 1 indicates the difference between y(i) and x(i). For Examples 1-9 and 18-20, x(i) and x(i+1) have the same composition. Thus, the horizontal axis in FIG. 1 also indicates the difference between y(i) and x(i+1). Further, the vertical axis in FIG. 1 indicates the film thickness of the dislocation filter layer Y(i). Some of Examples 1-9 and 18-20 are plotted in FIG. 1 with black squares. The above Expressions (A)-(D) are calculated from the relationship in FIG. 1. The above Expressions (A) and (C) correspond to the straight line 1001 in FIG. 1. The above Expressions (B) and (D) correspond to the straight line 1002 in FIG. 1.

As described above, it is known that as the thickness of the stacked compound semiconductor material is increased, the dislocation density decreases. Therefore, for Examples 10, 11, and 12 in which the thickness of the stacked compound semiconductor layer is different, it is impossible to simply compare $R_a$ with other Examples 1-9 and 18-20.

In Examples 1, 3, 4, 5, 7, 8, 9, 18, 19, and 20, it is possible to obtain a $R_a$ as high as at least 4.0 times larger than that of Comparative Example 1. In this case, the following relational expressions (I)-(L) are satisfied:

$0<t_{y(i)}\leq 6901\times(y(i)-x(\mathbf{1}))-1087(0.16\leq y(i)-x(i)\leq 0.19)$ Expression (I)

$0<t_{y(i)}\leq -2673\times(y(i)-x(i))+699(0.19<y(i)-x(i)\leq 0.25)$ Expression (J)

$0<t_{y(i)}\leq 6901\times(y(i)-x(i+1))-1087(0.16\leq y(i)-x(i+1)\leq 0.19)$ Expression (K)

$0<t_{y(i)}\leq -2673\times(y(i)-x(i+1))+699(0.19<y(i)-x(i+1)\leq 0.25)$ Expression (L)

The above Expressions (I)-(L) are calculated from the relationship in FIG. 1. The above Expressions (I) and (K) correspond to the straight line 1021 in FIG. 1. The above Expressions (J) and (L) correspond to the straight line 1022 in FIG. 1.

In Examples 1, 3, 4, 5, 7, 8, 18, 19, and 20, which satisfy the following relational expressions (M)-(P), it was found that it is possible to obtain a $R_a$ as high as at least 5.0 times larger than that of Comparative Example 1.

$0<t_{y(i)}\leq 1993\times(y(i)-x(i))-242(0.13\leq y(i)-x(i)\leq 0.19)$ Expression (M)

$0<t_{y(i)}\leq -1040\times(y(i)-x(i))+324(0.19<y(i)-x(i)\leq 0.29)$ Expression (N)

$0<t_{y(i)}\leq 1993\times(y(i)-x(i+1))-242(0.13\leq y(i)-x(i+1)\leq 0.19)$ Expression (O)

$0<t_{y(i)}\leq -1040\times(y(i)-x(i+1))+324(0.19<y(i)-x(i+1)\leq 0.29)$ Expression (P)

The above Expressions (M)-(P) are calculated from the relationship in FIG. 1. The above Expressions (M) and (O) correspond to the straight line 1031 in FIG. 1. The above Expressions (N) and (P) correspond to the straight line 1032 in FIG. 1.

In Examples 1, 3, 4, 5, 7, and 8, which satisfy the following relational expressions (E)-(H), it was found that it is possible to obtain a $R_a$ as high as at least 5.2 times larger than that of Comparative Example 1.

$0<t_{y(i)}\leq 3067\times(y(i)-x(i))-472(0.16\leq y(i)-x(i)\leq 0.19)$ Expression (E)

$0<t_{y(i)}\leq -1188\times(y(i)-x(i))+322(0.19<y(i)-x(i)\leq 0.25)$ Expression (F)

$$0 < t_{y(1)} \leq 3067 \times (y(i)-x(i+1))-472 (0.16 \leq y(i)-x(i+1) \leq 0.19)$$ Expression (G)

$$0 < t_{y(1)} \leq -1188 \times (y(i)-x(i+1))+322 (0.19 < y(i)-x(i+1) \leq 0.25)$$ Expression (H)

The above Expressions (E)-(H) are calculated from the relationship in FIG. 1. The above Expressions (E) and (G) correspond to the straight line 1011 in FIG. 1. The above Expressions (F) and (H) correspond to the straight line 1012 in FIG. 1.

In Examples 1, 16 and 17, the thickness of the first layer is the same, and only the number of repetitions of dislocation filter structures is different. In this respect, it can be seen that the $R_a$ increases as the number of repetitions increases.

Examples 21 and 22 are examples in which Ga is contained in the dislocation filter layer, and it is understood that even in these cases, a $R_a$ as high as 6.3 and 6.4 times larger than that of Comparative Example 1 is obtained respectively.

For the infrared detecting devices formed in Examples 13 and 14 and Comparative Example 2, the $R_a$ was measured the same as in Examples 1-12 and Comparative Example 1. The $R_a$ obtained is listed in Table 2. In this case, the $R_a$ of the infrared detecting device formed in Comparative Example 2 is taken as 1.

Here, since in Examples 1-12, 18-20 and Comparative Example 1, and in Examples 13, 14 and Comparative Example 2, the Al composition of the light receiving layer, that is, the band gap of the light receiving layer is different, and so is the carrier concentration of the light receiving layer, we can not simply compare these. Therefore, Examples 13 and 14 are compared with Comparative Example 2 for the $R_a$.

For the infrared detecting devices formed in Example 15 and Comparative Example 3, the $R_a$ was measured the same as in Examples 1-12 and Comparative Example 1. The $R_a$ obtained is listed in Table 2. In this case, the $R_a$ of the infrared detecting device formed in Comparative Example 3 is taken as 1.

In Examples 13 and 14, a $R_a$ as high as 3.6 and 2.6 times larger than that of Comparative Example 2 was obtained respectively. In Example 15, a $R_a$ as high as 5.0 times larger than that of Comparative Example 3 was obtained. In Example 13, which includes a dislocation filter layer and for which $t_{y(i)}$, y(i), x(1), and x(i+1) satisfy the above relational expressions (A)-(P), it was found that the $R_a$ increases even if the Al composition z of the light receiving layer changes.

The invention claimed is:

1. An infrared detecting device comprising:
   a semiconductor substrate;
   a first layer formed on the semiconductor substrate and having a first conductivity type;
   a light receiving layer formed on the first layer; and
   a second layer formed on the light receiving layer and having a second conductivity type, wherein
   the first layer comprises, in the stated order: a layer having a film thickness $t_{x(1)}$ in nanometers and containing $Al_{x(1)}In_{1-x(1)}Sb$; a layer having a film thickness $t_{y(1)}$ in nanometers and containing $Al_{y(1)}In_{1-y(1)}Sb$; and a layer having a film thickness $t_{x(2)}$ in nanometers and containing $Al_{x(2)}In_{1-x(2)}Sb$,
   where $t_{y(1)}$, $t_{x(1)}$, $t_{x(2)}$, x(1), x(2), and y(1) satisfy the following relations:

$$0 < t_{y(1)} \leq 2360 \times (y(1)-x(1))-240 (0.11 \leq y(1)-x(1) \leq 0.19),$$

$$0 < t_{y(1)} \leq -1215 \times (y(1)-x(1))+427 (0.19 < y(1)-x(1) \leq 0.33),$$

$$0 < t_{y(1)} \leq 2360 \times (y(1)-x(2))-240 (0.11 \leq y(1)-x(2) \leq 0.19),$$

$$0 < t_{y(1)} \leq -1215 \times (y(1)-x(2))+427 (0.19 < y(1)-x(2) \leq 0.33),$$

$$0 < x(1) < 0.18,$$

$$0 < x(2) < 0.18,$$

$$t_{x(1)} \geq 200 \text{ nm},$$

$$t_{x(2)} \geq 200 \text{ nm},$$

$$t_{x(1)} > t_{y(1)}, \text{ and}$$

$$t_{y(1)} \leq 100 \text{ nm},$$

wherein for an integer i from 1 to n (2≤n≤6), the first layer comprises: a layered structure in which a layer containing $Al_{x(i)}In_{1-x(i)}Sb$ and a layer having a film thickness $t_{y(i)}$ in nanometers and containing $Al_{y(i)}In_{1-y(i)}Sb$ are sequentially stacked on top of one another in the stated order in n layers; and a layer containing $Al_{x(n+1)}In_{1-x(n+1)}Sb$ directly on the layer having a film thickness $t_{y(n)}$ in nanometers and containing $Al_{y(n)}In_{1-y(n)}Sb$,
   where $t_{y(i)}$, x(i), x(i+1), and y(i) satisfy the following relations:

$$0 < t_{y(i)} \leq 2360 \times (y(i)-x(i))-240 (0.11 \leq y(i)-x(i) \leq 0.19),$$

$$0 < t_{y(i)} \leq -1215 \times (y(i)-x(i))+427 (0.19 < y(i)-x(i) \leq 0.33),$$

$$0 < t_{y(i)} \leq 2360 \times (y(i)-x(i+1))-240 (0.11 \leq y(i)-x(i+1) \leq 0.19),$$

$$0 < t_{y(i)} \leq -1215 \times (y(i)-x(i+1))+427 (0.19 < y(i)-x(i+1) \leq 0.33),$$

$$0 < x(i) < 0.18, \text{ and}$$

$$0 < x(i+1) < 0.18;$$

wherein the layer containing $Al_{x(i)}In_{1-x(i)}Sb$ has a film thickness $t_{x(i)}$ in nanometers, and $t_{x(i)}$ and $t_{y(i)}$, satisfy the following relations:

$$t_{x(i)} \geq 200 \text{ nm},$$

$$t_{x(i)} > t_{y(i)}, \text{ and}$$

$$t_{y(i)} \leq 100 \text{ nm}.$$

2. The infrared detecting device according to claim 1, wherein $t_{y(i)}$, x(i), x(i+1), and y(i) satisfy the following relations:

$$0 < t_{y(i)} \leq 6901 \times (y(i)-x(i))-1087 (0.16 \leq y(i)-x(i) \leq 0.19),$$

$$0 < t_{y(i)} \leq -2673 \times (y(i)-x(i))+699 (0.19 < y(i)-x(i) \leq 0.25),$$

$$0 < t_{y(i)} \leq 6901 \times (y(i)-x(i+1))-1087 (0.16 \leq y(i)-x(i+1) \leq 0.19), \text{ and}$$

$$0 < t_{y(i)} \leq -2673 \times (y(i)-x(i+1))+699 (0.19 < y(i)-x(i+1) \leq 0.25).$$

3. The infrared detecting device according to claim 1, wherein $t_{y(i)}$, x(i), x(i+1), and y(i) satisfy the following relations:

$$0 < t_{y(i)} \leq 1993 \times (y(i)-x(i))-242 (0.13 \leq y(i)-x(i) \leq 0.19),$$

$$0 < t_{y(i)} \leq -1040 \times (y(i)-x(i))+324 (0.19 < y(i)-x(i) \leq 0.29),$$

$$0 < t_{y(i)} \leq 1993 \times (y(i)-x(i+1))-242 (0.13 \leq y(i)-x(i+1) \leq 0.19), \text{ and}$$

$0 < t_{y(i)} \leq -1040 \times (y(i)-x(i+1))+324 (0.19 < y(i)-x(i+1) \leq 0.29)$.

4. The infrared detecting device according to claim 1, wherein $t_{y(i)}$, $x(i)$, $x(i+1)$, and $y(i)$ satisfy the following relations:

$0 < t_{y(i)} \leq 3067 \times (y(i)-x(i))-472 (0.16 \leq y(i)-x(i) \leq 0.19)$, $0 < t_{y(i)} \leq -1188 \times (y(i)-x(i))+322 (0.19 < y(i)-x(i) \leq 0.25)$, $0 < t_{y(i)} \leq 3067 \times (y(i)-x(i+1))-472 (0.16 \leq y(i)-x(i+1) \leq 0.19)$, and $0 < t_{y(i)} \leq -1188 \times (y(i)-x(i+1))+322 (0.19 < y(i)-x(i+1) \leq 0.25)$.

5. The infrared detecting device according to claim 1, wherein the first conductivity type is n type and the second conductivity type is p type.

6. The infrared detecting device according to claim 1, wherein the semiconductor substrate is a GaAs substrate.

7. The infrared detecting device according to claim 1, wherein the light receiving layer contains $Al_zIn_{1-z}Sb$ ($0<z<0.18$).

8. The infrared detecting device according to claim 1, wherein $x(1)$ and $x(2)$ satisfy the following relations:

$0 < x(1) < 0.09$, and $0 < x(2) < 0.09$.

9. The infrared detecting device according to claim 1, wherein the light receiving layer contains $Al_zIn_{1-z}Sb$ ($0<z<0.09$).

10. The infrared detecting device according to claim 1, wherein at least one of the layer containing $Al_{x(1)}In_{1-x(1)}Sb$, the layer containing $Al_{y(1)}In_{1-y(1)}Sb$, or the layer containing $Al_{x(2)}In_{1-x(2)}Sb$ further contains As at a proportion of 3% or less with respect to all V group elements.

11. The infrared detecting device according to claim 1, wherein $t_{y(1)}$ is not more than 6 times a critical film thickness.

12. The infrared detecting device according to claim 1, wherein the light receiving layer has a line defect density of $3.0 \times 10^8$ [lines/cm$^2$] or less.

* * * * *